US008341567B1

(12) United States Patent
Tiwary et al.

(10) Patent No.: US 8,341,567 B1
(45) Date of Patent: Dec. 25, 2012

(54) BOOLEAN SATISFIABILITY BASED VERIFICATION OF ANALOG CIRCUITS

(75) Inventors: Saurabh K. Tiwary, Berkeley, CA (US); Anubhav Gupta, Berkeley, CA (US); Joel R. Phillips, Oakland, CA (US); Claudio Pinello, Berkeley, CA (US); Radu Zlatanovici, Oakland, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 329 days.

(21) Appl. No.: 12/345,449

(22) Filed: Dec. 29, 2008

(51) Int. Cl.
*G06F 9/455* (2006.01)
*G06F 17/50* (2006.01)
(52) U.S. Cl. ........................ 716/106; 716/111
(58) Field of Classification Search .................. 716/106, 716/111
See application file for complete search history.

(56) References Cited

U.S. PATENT DOCUMENTS 6,975,972 B1 * 12/2005 Vreugdenhil et al. ............ 703/2
7,020,856 B2 * 3/2006 Singhal et al. ................. 716/106

OTHER PUBLICATIONS

Schonherr, Jens; Freibothe, Margin; Straube, Bernd; Bormann, Jorg; "Semi-formal verification of the steady state behavior of mixed-signal circuits by SAT-based property checking," Sep. 28, 2008, Elsevier.*
Grabowski, Darius; Olbrich, Markus; Barke, Erich; "Analog Circuit Simulation Using Range Arithmetics," Mar. 21, 2008, IEEE.*
Maulik, Prabir; Carley, Richard; Allstot, David; "Sizing of Cell-Level Analog Circuits Using Constrained Optimization Techniques," Mar. 1993, IEEE.*
Little, Scott; Walter, David; Jones, Kevin; Myers, Chris; "Analog/Mixed-Signal Circuit Verification Using Models Generated from Simulation Traces," 2007, ATVA '07.*

* cited by examiner

*Primary Examiner* — Vuthe Siek
*Assistant Examiner* — Eric Lee
(74) *Attorney, Agent, or Firm* — Schwegman Lundberg & Woessner, P.A.

(57) ABSTRACT

A method is provided to formally verify a property of a circuit design comprising: receiving a description of at least a portion of the circuit; receiving an indication of search accuracy criteria; receiving a description of a relationship between current and voltage (I-V relationship) for one or more of devices of the circuit; converting each I-V relationship to a conservative approximation of such I-V relationship; assigning voltage labels to one or more terminals of one or more identified devices that indicate voltage relationships among the one or more terminals consistent with KVL; defining a respective current relationship among one or more respective sets of currents of the one or more of the identified devices that is consistent with KCL; searching for one or more combinations of current and voltage values that are within at least one region of each conservative approximation and that are consistent with the voltage labels and that are consistent with each respective defined current relationship; converting each region determined to have a searched for combination of current and voltage values to multiple respective smaller regions; and repeating the acts of searching and converting until regions are obtained that meet the received search accuracy criteria.

45 Claims, 21 Drawing Sheets

DC characteristics of Inverter

BOOLEAN SATISFIABILITY BASED VERIFICATION OF ANALOG CIRCUITS

BACKGROUND OF THE INVENTION

1. Field of the Invention

The invention relates in general to formal verification of a system, and more particularly, to verification of analog circuits.

2. Description of the Related Art

FIG. 1 is an illustrative drawing of flow of a typical analog circuit verification process. SPICE remains the tool of choice for analog circuit designers. The most common way of verifying analog circuits has been to run a sequence of SPICE simulations and post processing the simulation results to find if the circuit fails to meet the specifications for any of the sampled cases. Once the failing cases have been identified, the design is tweaked and the simulations redone. This process is repeated until the circuit passes all the tests. More specifically, referring to FIG. 1, a verification process 100 typically involves a loop in which a circuit netlist 102 for a design that identifies devices and nets interconnecting the devices is input to an analog simulation tool 104 such as SPICE. The SPICE simulation tool produces a circuit simulation 106, which is evaluated for compliance with circuit performance constraints. A design optimization tool 108 uses the evaluation results as a basis to modify the circuit design and its netlist. The cycle repeats until acceptable results are achieved.

In general, designers design block level circuits such as opamps and comparators, for example, and run large number of simulations to verify them. Aggressive scaling down of device dimensions due to advances in semiconductor manufacturing technologies has made these designs ever more challenging as designers need to ensure that the circuit works over wide ranges of process, voltage and temperature (PVT) conditions. The verification process of the general type described above is a very time consuming methodology with no guarantees that the circuit will work in all possible simulation scenarios that have not been tested. As a result, experienced analog circuit designers often spend a significant portion of their time designing basic circuit blocks and porting them from one technology node to another. There is a real need for a formal verification methodology that can improve circuit predictability while allowing the designers to focus on more challenging circuits.

A circuit simulation problem that SPICE solves typically involves a set of KCL (Kirchoff's Current Law) equations. See, for example, T. Quarles, The SPICE3 implementation guide, In UCB/ERL M89/44, April 1989. The current values are obtained from device models, e.g., BSIM3, V=IR relationships, etc. The Kirchoff's Voltage Law is ensured to hold by intelligently labeling the voltage nodes. SPICE performs local searches from some carefully chosen starting point via Newton-Raphson iterations to find a solution to these equations.

The primary goal of SPICE in the early phase of its development in the 1970's was to simulate a single circuit instance—with fixed width and lengths of transistors, values of parasitics, transistor model parameters, input conditions, etc. As newer, aggressive manufacturing processes were developed, the problem of designing a circuit became more challenging. Designers now often have to design circuits that should meet the specifications not only at the nominal conditions but also for many different environmental conditions (process, voltage, temperature, input stimuli, etc.) in which the circuit could operate. Thus, the circuit simulation problem has transformed into a verification problem wherein the designer is looking for some "guarantees" on the behavior of the circuits. Much work has gone into the further development of SPICE to handle these new simulation/verification scenarios, e.g., ability to handle process corners, Monte Carlo simulation, measurement description language (SpectreMDL), native simulation speed-up (Ultrasim), circuit synthesis. See, for example, A. H. Shah, S. Dugalleix, and F. Lemery High-performance *CMOS-amplifier design uses front-to-back analog flow*, EDN, 2002.), etc.

One problem with SPICE is that the core algorithm is geared towards solving a single simulation problem, which falls short of addressing the verification challenges of designers, finally leaving it to the designers' insight to find the failing cases. Another problem with SPICE-based circuit simulation is that the underlying core algorithm is based on local search of the solution space (Newton-Raphson). Due to the local nature of the search, it can be difficult to use SPICE to determine whether the circuit does not obey a property over a range of operating conditions. For example, a property to be checked may be whether a start up circuit always "starts-up" for a range of initial conditions.

The use of digital verification techniques for analog circuit verification has been proposed as an alternative to SPICE-based verification. Some of the earlier attempts at applying digital verification techniques to the analog domain were presented in R. P. Kurshan and K. L. McMillan, Analysis of digital circuits through symbolic reduction, *IEEE Transactions on CAD*, pages 1356-1371, 1991. Various tools focusing on hybrid verification have been developed that could be extended for analyzing dynamical systems representing analog circuits. See, for example, G. Frehse. Phaver: Algorithmic verification of hybrid systems past hytech, *Proc. of the 5th International Workshop on Hybrid Systems: Computation and Control (HSCC)*, pages 258-273, 2005; E. Asarin, O. Bournez, T. Dang, and O. Maler, Approximate reachability analysis of piecewise linear dynamical systems, Hybrid Systems: Computation and Control, 2000; J. Kapinski and B. H. Krogh, Verifying switched mode computer controlled systems. In *IEEE Conference on Computer-Aided Control System Design*, pages 98-103, 2002; and T. A. Henzinger, P.-H. Ho, and H. Wong-Toi. HyTech: A model checker for hybrid systems *Lecture Notes in Computer Science* 1254, Springer-Verlag, pages 460-463, 1997.

Recently, hybrid verification techniques have been applied to verify transient properties for analog circuits. See, for example, G. Frehse, B. H. Krogh, and R. A. Rutenbar, Verifying analog oscillator circuits using forward/backward refinement, DATE, pages 257-262, 2006; S. Gupta, B. H. Krogh, and R. A. Rutenbar, Towards formal verication of analog designs, ICCAD, pages 210-217, 2004; S. Little, N. Seegmiller, D. Walter, C. Myers, and T. Yoneda, Verification of analog/mixed-signal circuits using labeled hybrid petri nets, ICCAD, 2006; and D. Walter, S. Little, and C. Myers, Bounded model checking of analog and mixed-signal circuits using an SMT solver, Automated Technology for Verification and Analysis, 2007. Unfortunately, the practicality of some of these methods is limited by the constraint on the underlying circuits to have a linear behavior. The proposed methodologies, sometimes, also require a simpler abstract model for a given circuit block that they need as a starting point. See, D. Walter et al, for example. These assumptions themselves introduce (over and under) approximations in the starting models that are used by the different verification techniques to prove properties. Since, there is a disconnect between these base models and the underlying transistor level circuits, any formal proofs on the models have limited practical usefulness.

Thus, there has been a need for improvements in techniques to verify systems over a range of properties. In particular, there has been a need for improvements in techniques to verify analog and mixed signal circuits. The present invention meets this need.

SUMMARY OF THE INVENTION

In one aspect of the invention, a method is provided to formally verify a property of a circuit design. A description of at least a portion of the circuit and a description of a relationship between current and voltage (I-V relationship) for one or more devices in the circuit are used to produce conservative approximations for device I-V behavior. Voltage labels are assigned to one or more terminals of one or more of the devices that indicate voltage relationships among the one or more terminals consistent with KVL. Current relationship among one or more respective sets of currents of the one or more of devices are defined that are consistent with KCL. A search is performed for one or more combinations of current and voltage values that are within at least one region of each conservative approximation and that are consistent with the voltage labels and that are consistent with each defined current relationship. Regions determined to have a searched for combination of current and voltage values are converted to multiple respective smaller regions. The acts of searching and converting are repeated until regions are obtained that meet search accuracy criteria.

These and other features and advantages of the invention will be appreciated from the following detailed description of embodiment thereof in conjunction with the following drawings.

BRIEF DESCRIPTION OF THE DRAWINGS

FIGS. 14A-4B are illustrative graphical representations of a coarse grained table (FIG. 14A) that is refined to a less coarse grained table (FIG. 14B) in accordance with some embodiments of the invention.

DETAILED DESCRIPTION OF PREFERRED EMBODIMENTS OF THE INVENTION

The present invention provides a novel method and apparatus for SAT-based verification of a system design. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Overview

SAT-based methods have traditionally been popular for formally verifying properties for digital circuits. In accordance with some embodiments of the invention, a methodology is provided for formulating a SPICE-type circuit simulation problem as a satisfiability problem that can be solved using a SAT solver. A transistor level description, such as netlist, is obtained for a circuit design. A netlist comprises a connected collection of devices and nets. Each device has a set of one or more terminals. Nets connect two or more terminals. Each device is characterized by a set of parameters, which include I-V relationships that characterize behavior of devices in the circuit design. The I-V relationships are obtained either from device models (e.g., BSIM3) or from measurements from actual devices. The I-V relationships are converted to conservative approximations, which are used as constraints to transform the simulation problem into a search problem that can be exhaustively explored via a SAT solver. Device terminals are labeled with "through" quantities, and pairs of terminals are labeled with "across" quantities. For electrical devices, current is a "through" quantity, and voltage and charge are "across" quantities. These correspond to the conservation laws, KCL and KVL, which also serve as constraints upon the search space explored by the SAT solver. Thus, for DC as well as fixed time-step based transient and periodic steady state (PSS) simulation formulations, for example, the solutions produced by the solver are formal in nature.

Figure 1:
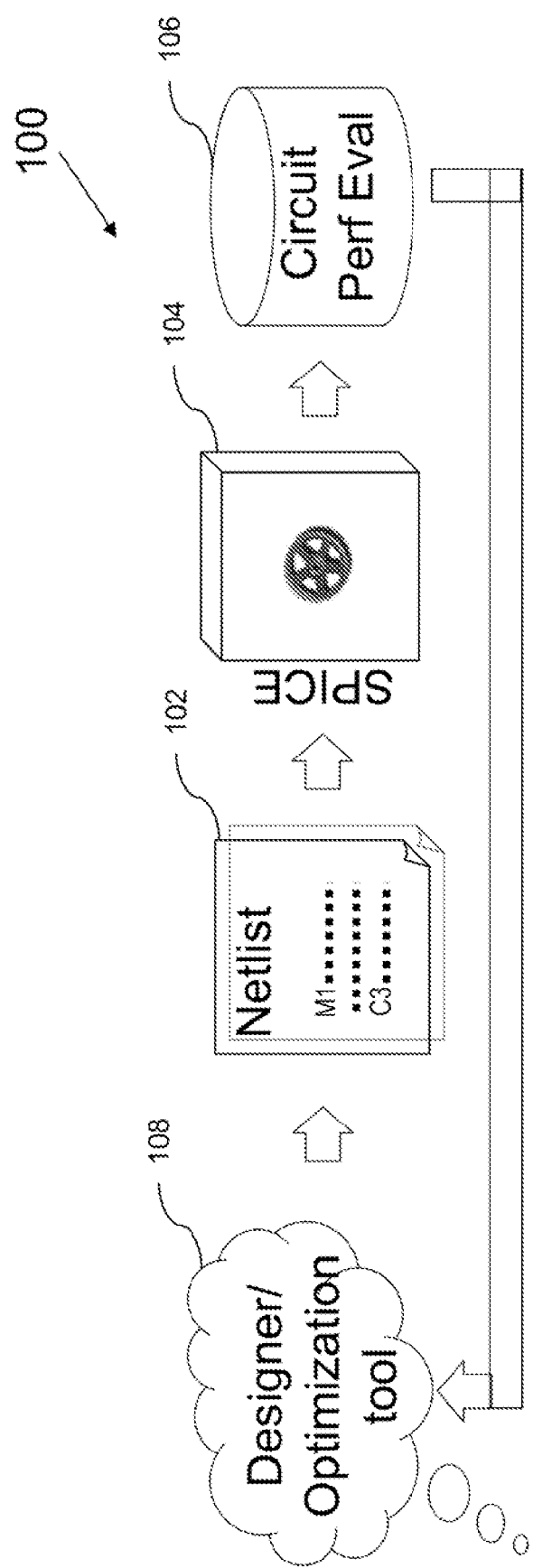
FIG. 1 is an illustrative drawing of flow of a typical analog circuit verification process.
Figure 2:
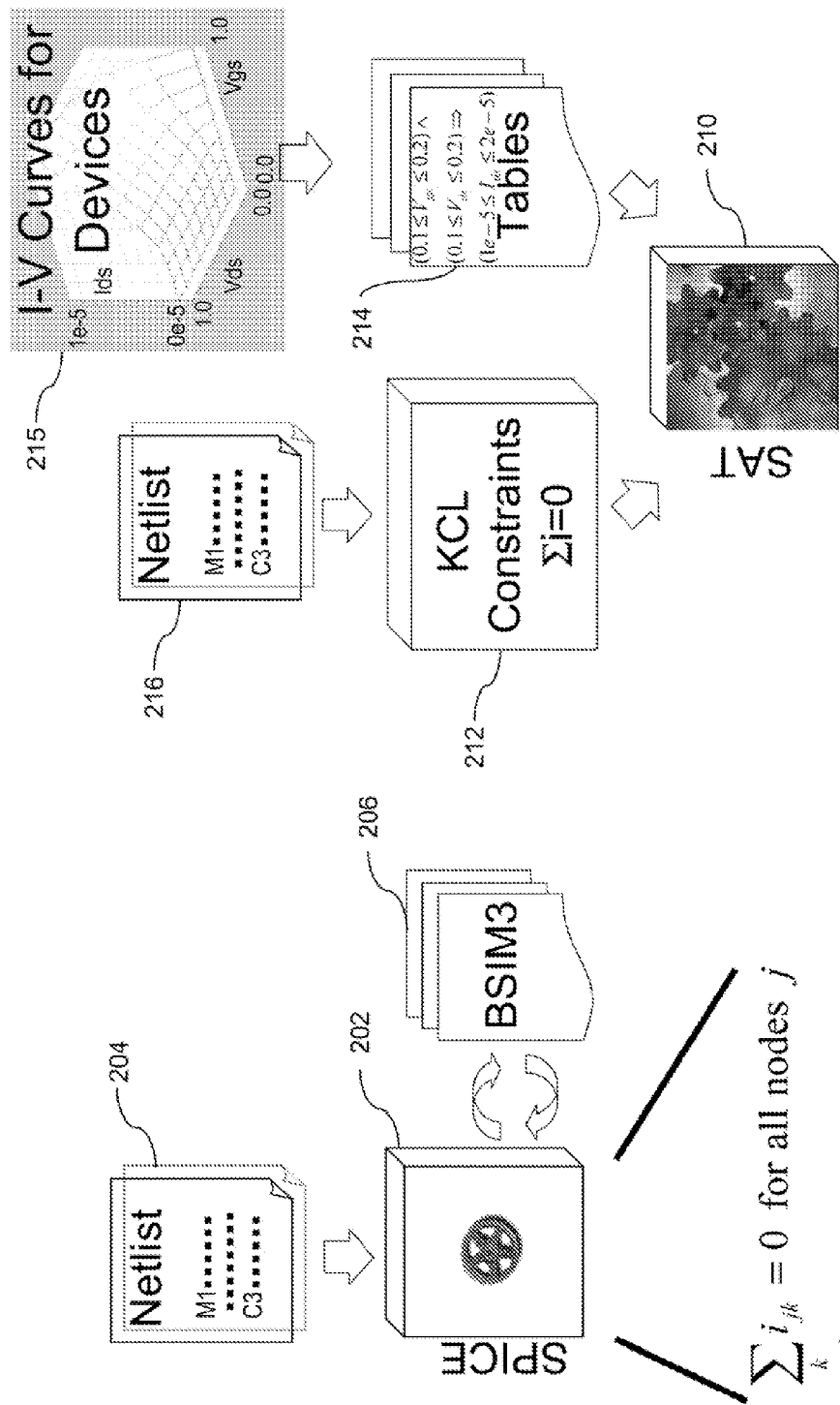
FIGS. 2A-2B are illustrative flow diagrams comparing a typical SPICE-based simulation flow (FIG. 2A) with a SAT-based verification flow (FIG. 2B) in accordance with some embodiments of the invention.

FIGS. 2A-2B are illustrative flow diagrams comparing a typical SPICE-based simulation flow (FIG. 2A) with a SAT-based verification flow (FIG. 2B) in accordance with some embodiments of the invention. FIG. 2A shows a SPICE simulation tool 202 that runs on a computer system (not shown) and that receives an input netlist 204 and interfaces with device libraries 206 such as BSIM3 that contain device behavior information. The SPICE tool 202 simulates the circuit represented by the netlist 204 by using device equations from the device models to solve KCL 208 for nodes terminals (not shown) within the netlist 204.

FIG. 2B shows a SAT-based solver 210 that runs on a computer system (not shown) and that receives as input, KCL constraints 212 and tables 214 that provide conservative approximations of device behavior in accordance with some embodiments of the invention. The KCL constraints 212 are formulated based upon connections among devices described in a netlist 216. The conservative approximations are formulated based at least in part upon I-V relationships 215 for the devices identified in the netlist 216. The I-V relationships 215 may be represented as curves and may be ascertained from device models, such as BSIM3, or through measurement of actual device behavior.

Figure 3:
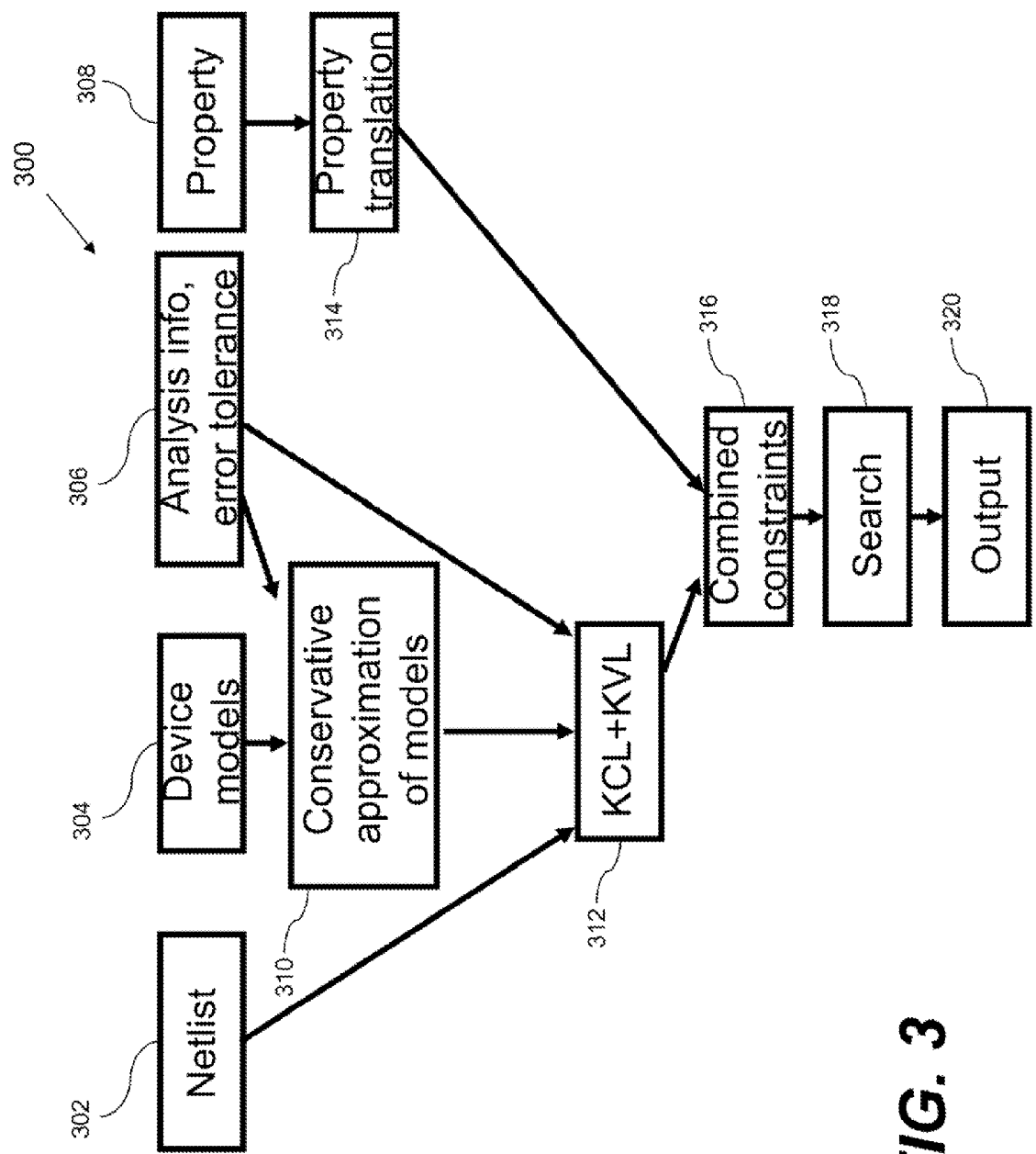
FIG. 3 is an illustrative flow diagram of a process to verify properties of a circuit in accordance with some embodiments of the invention.

FIG. 3 is an illustrative flow diagram of a process 300 to verify properties of a circuit in accordance with some embodiments of the invention. Computer program instructions encoded in a computer readable medium (not shown) are used to program a computer system (not shown) to implement the process 300. Input block 302 provides a description of the circuit such as a transistor level circuit netlist. Input block 304 provides device I-V relationships for devices identified in the circuit description. Input block 306 provides analysis information and error tolerance. The analysis information may specify a type of analysis such as DC, Transient, PSS or a some special analysis such as one aimed at finding the period of oscillation during PSS for example. The error tolerance information indicates search accuracy required for a solution such as voltage accurate to within one microvolt, for example. Input block 308 provides information concerning properties to be included in the verification. Properties may include constraints on current or on voltage or on one or more other device characteristic such as a physical property such as gate width or gate length or channel width or an electrical property such as threshold voltage, or an environmental property such as temperature or processing steps or input signals, for example. Properties can be expressed in combination such as, $[((V_A+V_B)/2<0)$ && $W_1>50$ nm], for example. Block 310 converts device I-V relationships to conservative approximations of such devices based upon information provided by input block 306. Block 312 assembles constraints compliant with KCL and KVL based upon information provided by blocks 302, 304 and 306. Block 314 translates property information to an optimal form for use by a SAT solver. For example, if the test is to determine whether a particular property always holds, then the SAT solver may search for a negation of the property. In such case, block 314 translates the property to such negation of the property. Block 316 presents a formulation representing combined constraints based upon input from blocks 312 and 314. Block 318 searches for solutions that satisfy the combined constraints of block 316. Block 320 presents an output that represents a result of the search performed by block 318. If block 318 determines that there is no solution, then block 320 provides an output that indicates that no solution exists, e.g., that the result is "unsat". On the other hand, if block 318 determines that a solution exists, then the block 320 provides an output that indicates a range of possible solutions that includes at least one actual solution that satisfies the combined constraints of block 316.

In some embodiments, block 318 employs a SAT solver or some other theorem prover such as a Satisfiability Modulo Theories (SMT) solver or an Integer Linear Programming (ILP) solver to perform an exhaustive search to find all solutions. The conservative approximations and the exhaustive search in conjunction with a transistor level circuit netlist guarantees that such search is formal in nature as compared to SPICE—meaning, (a) no solution is missed that SPICE can come up with; and (b) there exists the ability to list all solutions to a given simulation problem.

It will be appreciated that the process described herein is formal in the sense that if the process reports that the property does not hold, then the circuit too does not satisfy the property. If the circuit has a real solution, the process returns a set of solutions that contains the real circuit solution. Because of over-approximation, it returns some extra solutions. The amount of over-approximation (and hence extra solutions) is traded-off with run-time.

From a practical implementation perspective, the formulation supports both ODEs (Ordinary Differential Equations) and DAEs (Differential Algebraic Equations). DAEs are the ones that are commonly observed in circuit simulators.

Constraints Based Upon Conservative Approximations of Device I-V Relationships A MNA (Modified Nodal Analysis) method described by, T. Quarles, in The SPICE3 implementation guide, in *UCB/ERL M*89/44, April 1989, which SPICE uses while solving a circuit simulation problem, applies the KCL (Kirchoff's Current Law) and KVL (Kirchoff's Voltage Law) equations to preserve the voltage and current relationships between the circuit elements. In some embodiments, compliance with Kirchoff's Voltage Law (KVL) is ensured by labeling of voltages at nodes within a netlist description so as to indicate that nodes of different devices that are directly coupled to each other share the same voltage value. The I-V relationships associated with devices in such a netlist description, for example, are converted to constraints represented using conservative approximations in the form of tables that employ the labeled voltages. Non-linearity in the equations may arise due to the I-V relationships for the devices. Also, almost all of the non-linear I-V relationships are monotonic with respect to the device parameters. It will be appreciated that successive members of a monotonic sequence either consistently increase or decrease but do not oscillate in relative value. That is, each member of a monotonic increasing sequence is greater than or equal to the preceding member; each member of a monotonic decreasing sequence is less than or equal to the preceding member. For example, $I_{ds}$ of a MOS transistor is monotonic with respect to $V_{gs}$, $V_{ds}$, $t_{ox}$, etc. This is because of the basis of the device models like BSIM3 rely on the underlying device physics. This monotonic relationship is not easily found at higher levels of granularity, for example, modeling the circuits at the block level, etc. A SAT-based solution strategy in accordance with some embodiments of the invention uses this fact during the representation of the I-V relationships of the devices using intervals instead of fixed values. The intervals give us the flexibility of covering a range of values in a single "simulation". We have an abstract interval-based representation of the current equations for the non-linear MOS devices using conservative tables. As an example, a BSIM3 device can be represented by tables with entries of the form:

$$(0.1 < V_{gs} \leq 0.2) \& (0.6 < V_{ds} \leq 0.7) \Rightarrow (1\ \mu A < I_{ds} \leq 2\ \mu A) \quad (1)$$

For constructing the table, the notion of independent variables $(x_1, x_2, \ldots, x_N)$ and dependent variables $(y_1, y_2, \ldots, y_M)$ for the voltage and current variables, respectively, is introduced for the different devices. For a given set of interval ranges for the independent variables, the $x_i$'s would form a hypercube. It will be understood that the term hypercube refers to a geometric figure (as a tesseract) in Euclidean space of n dimensions that is analogous to a cube in three dimensions. The supremum and infimum values are determined for each of the dependent variables within this hypercube to obtain a relationship of the form shown in Eqn. 1. Suppose the relationship between the independent variables and the dependent variables is of the form $$y_j = f_j(x_1, x_2, \ldots, x_N) \forall j \in \{1, 2, \ldots, M\} \quad (2)$$

Then, for some specified range E for the independent variables defined by $$E = \{x / x_{k min} < x_k \leq x_{k max} \forall k \in \{1, 2, \ldots, N\}\} \quad (3)$$

a determination is made as to representations for $y_{j\ min}$ and $y_{j\ max}$ of the form $$y_{j max} = \sup_{x \in E} f_j(x_1, x_2, \ldots, x_N) \forall\ j \in \{1, 2, \ldots, M\} \quad (4)$$

$$y_{j min} = \inf_{x \in E} f_j(x_1, x_2, \ldots, x_N) \forall\ j \in \{1, 2, \ldots, M\} \quad (5)$$

to obtain the relationship of the form $$(x_{1 min} < x_1 \leq x_{1 max}) \& \ldots \& (x_{N min} < x_N \leq x_{N max})$$
$$\Rightarrow (y_{1 min} < y_1 \leq y_{1 max}) \& \ldots \& (y_{M min} < y_M \leq y_{M max}) \quad (6)$$

For a given device, these relationships are constructed so that the entire region of operations is covered by the union of the hypercubes.

This formulation provides a conservative approximation of the underlying relationship between the independent and dependent variables. That is, the actual relationship between the variables is always enclosed within the interval based tables, and a range of additional combinations of such variables also is encompassed by such conservative approximation. Hence, even though the conservative approximation over-approximates and thereby adds some superfluous relationships between the variables, the actual relationship is always captured within the intervals.

Generally, there is no requirement to select the set of voltage or current variables as dependent or independent variable from an overall algorithmic perspective. However, from a practical implementation perspective one of the elements often turns out to be a better choice than the other. In modern MOS designs, the voltage values at all the terminals of the circuit are bounded by the supply voltage (Vdd) and ground (Vss). Hence, to get a complete coverage of the possible values encountered in designs, it is often desirable to choose the voltages as independent and currents as dependent variables. Another reason for such a choice is that for most of the transistor models, the currents are monotonic functions of the terminal voltages. This choice helps in constructing the table because, for a transistor, the supremum and infimum current values within a given hypercube of terminal voltage values lie at its corners.

These tables also can be reinterpreted in boolean form. One mechanism for doing this is by having a boolean representation for each interval. Suppose, $V_{gs}$ and $V_{ds}$ vary from 0 to 0.8 V and $I_{ds}$ varies from 0 to 16 µA. Then, by slicing the voltage and currents into 8 and 16 equispaced intervals respectively, the voltages can be represented by boolean bit vectors from 000 to 111 and current from 0000 to 1111. Here, a voltage value of 000 implies that the voltage is in the range from 0.0 to 0.1 volts. Similarly, a current value of 0001 implies current in between 1 µA and 2 µA. Hence, an entry for the table from Eqn. 1 could be rewritten as:

$$(V_{gs} = 001) \& (V_{ds} = 110) \Rightarrow (Ids = 0001) \quad (7)$$

It is important to note that, in general, these intervals need not be equi-spaced. In cases where the current variable has a strongly non-linear relationship (e.g., exponential) with the voltage variable, the dynamically spaced intervals help to more compactly capture the relevant information about the devices. For example, in the cut-off region of a transistor the voltage intervals can be made larger. While, in regions where the transistor turns on such as in the saturation region, the voltage values can be made smaller and more densely sampled.

In some embodiments, additional terms can be added as independent variables apart from voltages at the terminals of the transistors. For example, the tables can be built with widths (W) and lengths (L) of the transistors as independent variables as well. This would help formulate circuit synthesis problems, where the goal is to find the optimal W's and L's for the transistor for which the circuit satisfies a certain set of properties. In another scenario, for example, tables could be built with circuit fabrication process parameters as independent variables, to query if the circuit fails for a certain set of values for the process conditions. A table entry similar to Eqn. 1 with the width of the transistor (W) as an additional parameter serving as an additional constraint may look like the following $$(90\ nm < W \leq 180\ nm) \& (0.1 < V_{gs} \leq 0.2) \&$$
$$(0.6 < V_{ds} \leq 0.7) \Rightarrow (1\ \mu A < I_{ds} \leq 3\ \mu A) \quad (8)$$

Thus, it will be understood that it is a relatively easy task to add extra constraints to the problem. For example, constraints can be added such as, find only those solutions for which the circuit meets the specifications and the transistors are in deep saturation. This could be extended in a more general form to cover corner conditions, to identify failure scenarios, etc. [e.g., find process and temperature conditions for which a spike occurs at the output of the circuit).

Constraints Based Upon KVL and KCl Equations

Kirchhoff's Current Law (KCL) equations are introduced, as they are by SPICE, in the form of algebraic equations which, simply put, say that the sum of the currents flowing into a node should be equal to zero. MNA (Modified Nodal Analysis) based node labeling is used (also used by SPICE) to ensure that KVL holds for the circuits. The KCL equations are ensured by additional constraints for the current variables. These constraints are of the form that all currents through the devices connected to a particular node should sum to zero as shown in Eqn. 9.

$$\begin{pmatrix} i_1 \\ i_2 \\ \vdots \\ i_N \end{pmatrix} = \begin{pmatrix} 0 \\ 0 \\ \vdots \\ 0 \end{pmatrix} \quad (9)$$

Here, $i_r$ is the sum of all currents flowing into node r. Concisely, Eqn. 9 can be written in vector form as Eqn. 10.

$$i=0 \quad (10)$$

This formulation is then fed to a SAT or SAT-like solver (e.g., SAT Modulo theory (SMT) solver) to find the solution to the circuit equations. See, for example, R. Nieuwenhuis, A. Oliveras, and C. Tinelli, Solving SAT and SAT modulo theories: From an abstract Davis-Putnam-Logemann-Loveland procedure to DPLL(T), *Journal of the ACM* 53(6), pages 937-977, 2006. The pure boolean formulation of the form shown in Eqn. 7 can be solved by a SAT solver. On the other hand, the same constraints can be specified in the form of linear inequalities as shown in Eqn. 6 and then used with an SMT solver with an underlying linear theory to obtain a solution.

Example

Resistor-Diode Circuit

Figure 4:
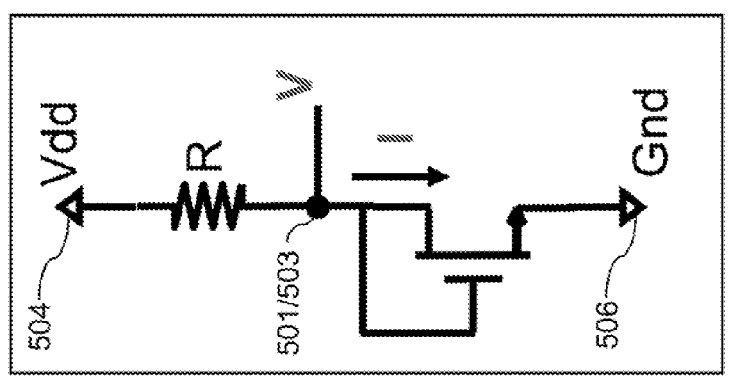
FIG. 4 is an illustrative drawing of a circuit that includes a resistor and a diode, which may be a portion of a larger circuit.

FIG. 4 is an illustrative drawing of a circuit that includes a resistor and a diode-connected transistor (hereinafter diode), which may be a portion of a larger circuit (not shown). The circuit includes a shared connection 501/503 between a terminal 501 of the transistor and a terminal 503 of the resistor associated with voltage V and current I as shown. A Vdd bias voltage is coupled to a terminal 504 of the resistor, and an effective ground voltage is coupled to a terminal 506 of the diode.

Figure 5:
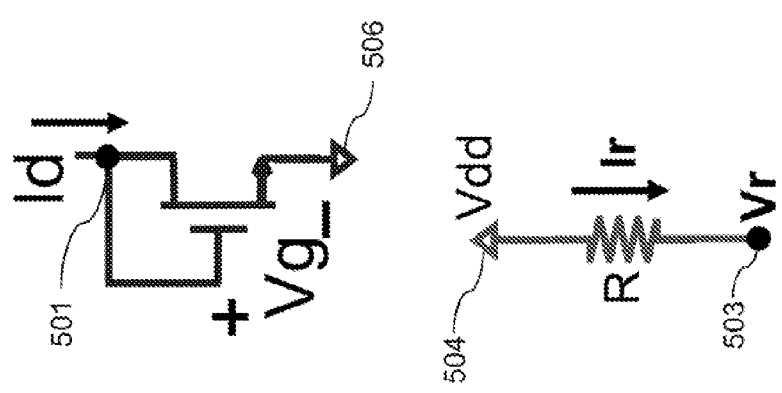
FIG. 5 is an illustrative drawing of showing separately the diode and the resistor of FIG. 4 and showing their associated currents and voltages.

FIG. 5 is an illustrative drawing of showing separately the diode and the resistor of FIG. 4 and showing their associated currents and voltages. The diode has terminals 501 and 506. Diode voltage Vg is across diode terminals 501 and 506. A diode current Id flows through the diode from terminal 501 to terminal 506. The resistor has terminals 504 and 503. A voltage Vdd is associated with resistor terminal 504, and a voltage Vr is associated with resistor terminal 503. Resistor current Ir flows through the resistor from terminal 504 to terminal 503.

Figure 6:
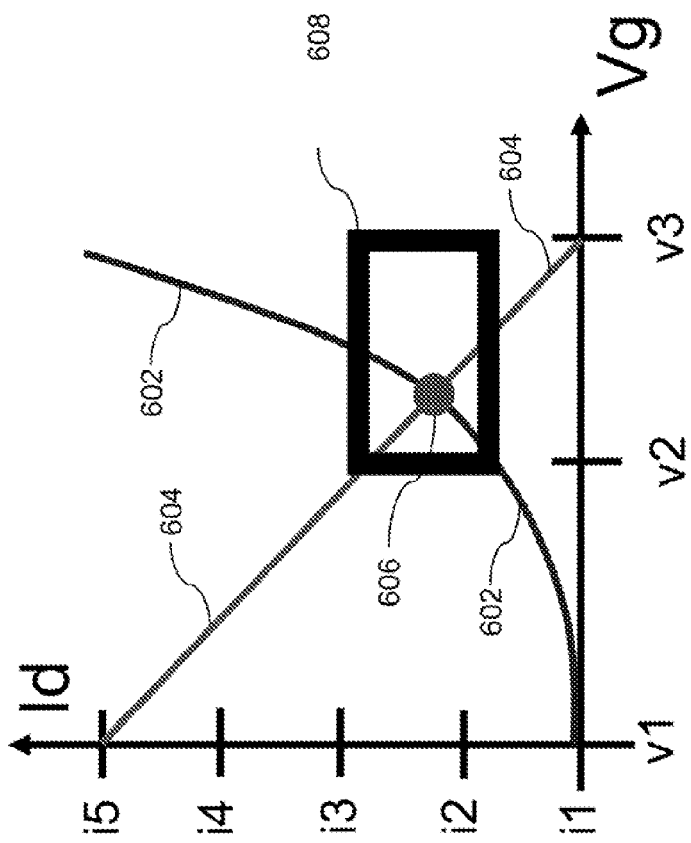
FIG. 6 is an illustrative coordinate system to show current-voltage (I-V) relationships for the diode and resistor of FIGS. 4-5.

FIG. 6 is an illustrative coordinate system to show current-voltage (I-V) relationships for the diode and resistor of FIGS. 4-5. A first curve 602 represents I-V behavior of the diode. A second curve 604 represents I-V behavior of the resistor. The point 606 at which the two curves intersect represents an I-V combination that is a solution to the I-V relationships of both devices. A bounding box 608 indicates that the I-V solution falls within a current value range (i2<Id<i3) and within a voltage value range (v2<Vg<v3).

Figure 7:
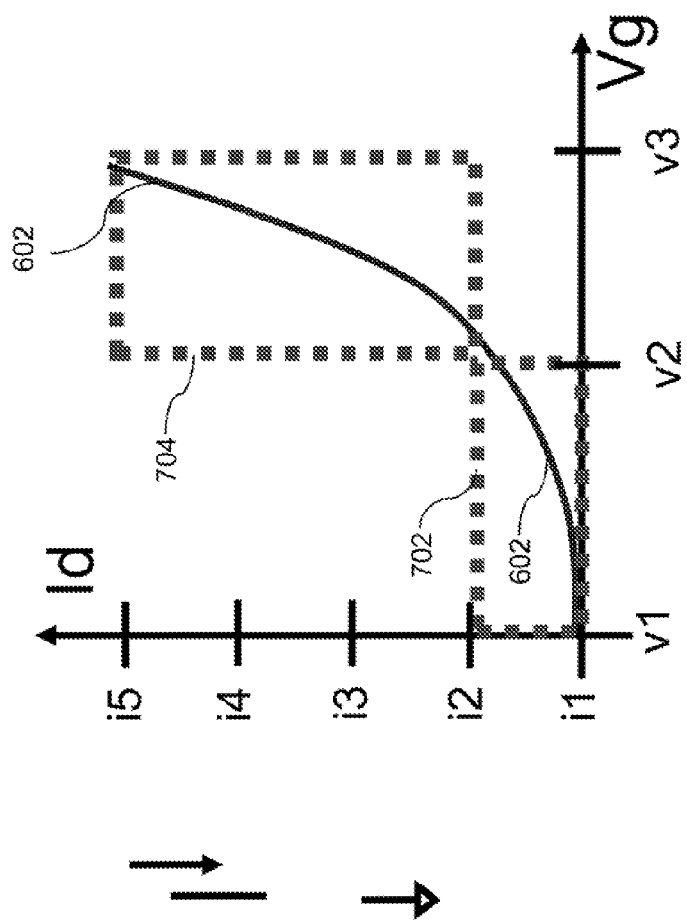
FIG. 7 is an illustrative drawing of the coordinate system of FIG. 6 showing a pair of bounding boxes that together represent a conservative approximation for the I-V relationship for the diode of FIGS. 4-5 in accordance with some embodiments of the invention.

FIG. 7 is an illustrative drawing of the coordinate system of FIG. 6 showing a pair of bounding boxes 702, 704 that together represent a 'first' conservative approximation of the IV relationship for the diode of FIGS. 4-5. A first bounding box 702 shown with dashed lines encompasses a region of the I-V coordinate space in which (vI<V<v2) and (iI<Id<i2). A second bounding 704 box shown with dashed lines encompasses a region of the I-V coordinate space in which (v2<V<v3) and (i2<Id<i5). The curve 602 representing I-V relationship characteristic of the diode passes within and is encompassed within the first and second bounding boxes 702, 704. In this example, voltage is an independent variable and current is a dependent variable, and a given range of voltage values implies a corresponding range of current values.

The illustrative conservative approximation of illustrated by the bounding boxes 702, 704 of FIG. 7 can be expressed in terms of the following logical expression, $$((v1<V<v2) \rightarrow (i1<Id<i2) \& (v2<V<v3) \rightarrow (i2<Id<i5))$$

In the above formulation, the symbol '→' signifies 'implies', and the symbol '&' signifies the logical AND operation. The above formulation sets forth a first constraint (v1<V<v2)→(i1<Id<i2) that defines the first bounding box 702 704, and sets forth a second constraint (v2<V<v3)→(i2<Id<i5) that defines the second bounding box. Together, the two bounding boxes define the first conservative approximation representing the I-V relationship for the diode.

Figure 8:
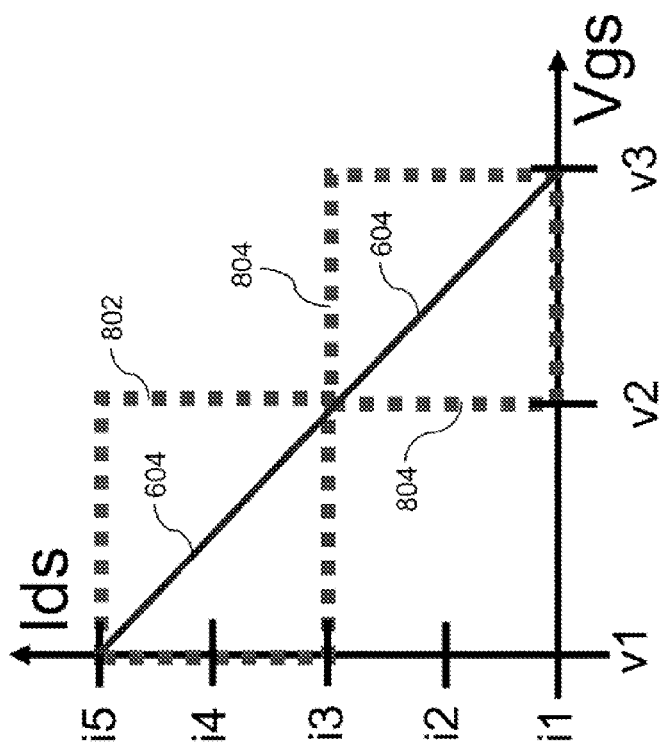
FIG. 8 is an illustrative drawing of the coordinate system of FIG. 6 showing a pair of bounding boxes that together represent a conservative approximation of the I-V relationship for the resistor of FIGS. 4-5 in accordance with some embodiments of the invention.

FIG. 8 is an illustrative drawing of the coordinate system of FIG. 6 showing a pair of bounding boxes 802, 804 that together represent a 'second' conservative approximation of the I-V relationship for the resistor of FIGS. 4-5. A third bounding box 802 shown within dashed lines encompasses a region of the I-V coordinate space in which (v1<V<v2) and (i3<Ir<i5). A fourth bounding box 804 shown within dashed lines encompasses a region of the I-V coordinate space in which (v2<V<v3) and (i1<Ir<i3).

The illustrative conservative approximation FIG. 8 can be expressed in terms of the following logical expression, $$((v1<V<v2) \rightarrow (i3<Ir<i5) \& (v2<V<v3) \rightarrow (i1<Ir<i3))$$

The above formulation sets forth a third constraint (v1<V<v2)→(i3<Ir<i5) that defines the third bounding box 802, and sets forth a fourth constraint (v2<V<v3)→(i1<Ir<i3) that defines the fourth bounding box 804. Together, the two bounding boxes define the second conservative approximation representing the I-V relationship for the resistor.

Referring to FIG. 7, it will be appreciated that the conservative approximation for the diode is 'conservative' since it encompasses the diode curve 602 representing the I-V relationship indicative of diode behavior, but it also encompasses additional includes I-V combinations that are not on the diode curve 602. Referring to FIG. 8, it will be appreciated that the conservative approximation for the resistor is 'conservative' since it encompasses the resistor curve 604 representing the I-V relationship indicative of resistor behavior, but it also encompasses additional I-V combinations that are not on the resistor curve 604.

In the diode example of FIG. 7 and the resistor example of FIG. 8, different intervals within a conservative approximation are non-overlapping. However, there is no requirement that such different intervals within a given conservative approximation not overlap.

Figure 9:
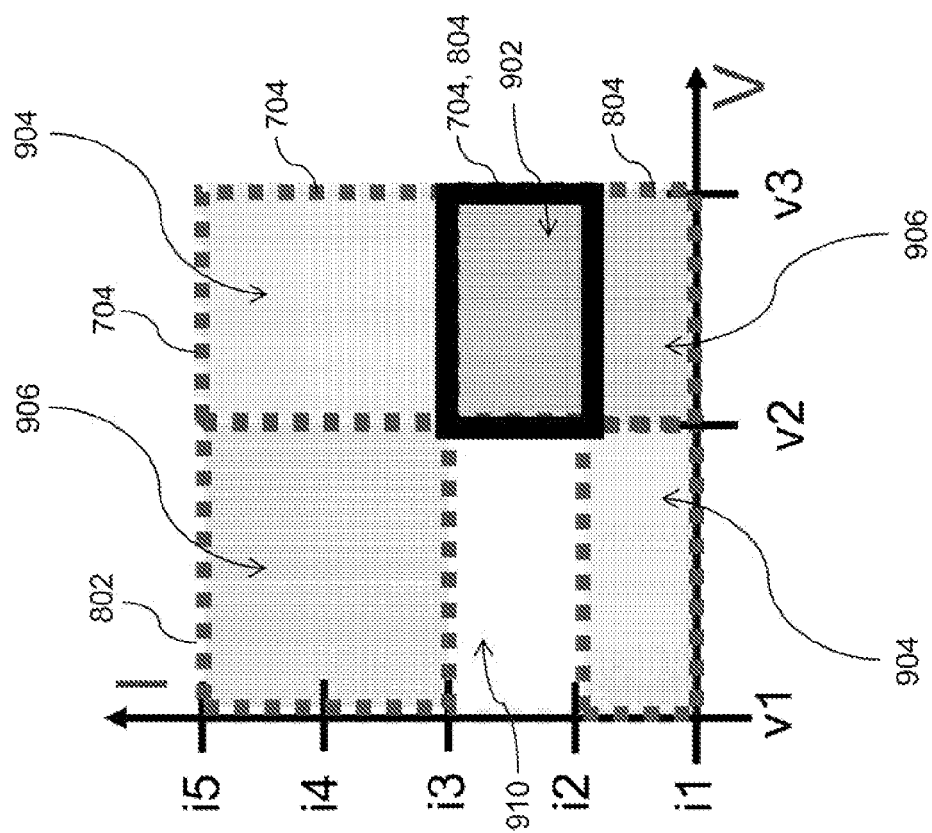
FIG. 9 is an illustrative drawing of the coordinate system that superimposes the first conservative approximation for the diode illustrated in FIG. 7 and the second conservative approximation for the resistor illustrated in FIG. 8 in accordance with some embodiments of the invention.

FIG. 9 is an illustrative drawing of the coordinate system that superimposes the first conservative approximation for the diode illustrated in FIG. 7 and the second conservative approximation for the resistor illustrated in FIG. 8 in accordance with some embodiments of the invention. The first and second conservative approximations together define a search space bounded by (v1<V<v3) and (i1<I<i5). As used herein, a search space is a range of constraints (V, I, X) for which an instance of a circuit under consideration is valid (e.g. allowed by the designer); where V and I represent the properties, voltage and current, and X represents a different property designated by a user such as transistor gate width (W), transistor gate length (L), threshold voltage $V_{th}$, oxide thickness $T_{OX}$, etc. A first region 902 of the search space bounded by (v2<V<v3) and (i2<I<i3) encompasses overlapping regions of the first and second conservative approximations. This overlapping region contains combinations of current and voltage values that are within both the first and second conservative approximations. Second regions 904 of the search space fall only within a portion of the first conservative approximation that represents the diode. Third regions 906 of the search space fall only within a portion of the second conservative approximation that represents the resistor. A fourth region 910 of the search region is not within either the first or the second conservative approximation.

Searching within the search space shown in FIG. 9 is constrained by the first and second conservative approximations and also by the conservation laws represented by Kirchhoff's current law (KCL) and Kirchhoff's Voltage Law (KVL). According to KCL, the sum of currents at a node is 0. The sum of the currents at the node at which the resistor and the diode are coupled together and through which both the resistor current Ir and the diode current Id flow can be represented as, $$(Ir-Id=0)$$

According to KVL, the sum of voltage about a loop is 0. Moreover, consistent with KVL, the voltage at the node at which the resistor and the diode are coupled together, such as at connection 501/503, is the same for both devices, and in accordance with principles of 'Modified Nodal Analysis' their common voltage is labeled with the common value 'V' in the first through fourth constraints defined above.

In this example, a 'sanity constraint' is provided to ensure that the independent variable V is bounded so as to reasonably limit the scope of the search space as follows, $$(v1<V<v3)$$

The search performed by block 318 of FIG. 3 identifies the region 902 of the search space for which the following constraints are satisfied:

$$(Ir-Id=0)$$

&

$$(v1<V<v3)$$

&

$$(v1<V<v2) \rightarrow (i1<I<i2) \&$$

$$(v2<V<v3) \rightarrow (i2<I<i5))$$

&

$$((v1<V<v2) \rightarrow (i3<I<i5) \&$$

$$(v2<V<v3) \rightarrow (i1<I<i3)$$

Block 318 may solve the above set of formulations using well known techniques such as a SAT solver or SMT solver, for example.

Continuing with the above set of constraints, a process to searching the search space involves determining, subject to the KCL and KVL constraints, whether the interval (v1<V<v2) within the search space contains a current-voltage combination from both the conservative approximation for the diode and for the conservative approximation for the resistor. Referring to FIG. 9, it can be seen that in this example, there is no region of the search space that contains current-voltage combinations from both such conservative constraints. Furthermore, searching the search space also involves determining, subject to KCL and KVL constraints, whether the (v2<V<v3) within the search space contains a current-voltage combination from both the conservative approximation for the diode and for the conservative approximation for the resistor. Referring again to FIG. 9, it can be seen that in this example, the region 902 within which (i2<I<i3) contains current-voltage combinations from both the conservative approximation for the diode and the conservative approximation for the resistor.

It will be appreciated that conservative approximation constraints may be represent differently depending upon whether a SAT solver or SMT solver is to be employed. For example, referring to FIG. 7, showing a curve representing I-v relationship for the resistor.

If we let, $$[v1,v2]=0\_v$$

$$[v2,v3]=1\_v$$

$$[i1,i3]=-0\_i$$

$$[i3,i5]=1\_i$$

Then an example Boolean representation of the conservative approximation for the resistor can be used by a SAT solver is, $$\text{If } v=0\_v \rightarrow i=1\_i$$

$$\text{If } v=1\_v \rightarrow i=\_i$$

And an alternate example SMT representation of the conservative approximation for the resistor that can be used by an SMT+LP (linear programming) solver within each Boolean region to seek a satisfiability of the linear program is, $$\text{If } v=0\_v \rightarrow i=i5-(v-v1)/R$$

$$\text{If } v=0\_v \rightarrow i=i3-(v-v2)/R$$

The above SMT representation can be used by an SMT+LP (linear programming) solver within each Boolean region to seek a satisfiability of the linear program. It will be understood that an expression of the general form (v1>V>v2) is an SMT-LP expression since it represents the formulation, (V>v1) && (V<v2) in which the sub-expressions (V>v1) and (V<v2) are linear expressions, and in which the operator "&&" is the Boolean "AND" operator. Alternatively, an interval or region can be defined in an SMT+quadratic expression such as $[(\alpha_1 v + \alpha_2 v^2) > 0) \&\& (\alpha_3 v + \alpha_4 v^2 > 0)]$, for example, which includes two quadratic expressions linked by the Boolean "AND" operator.

Figure 10:
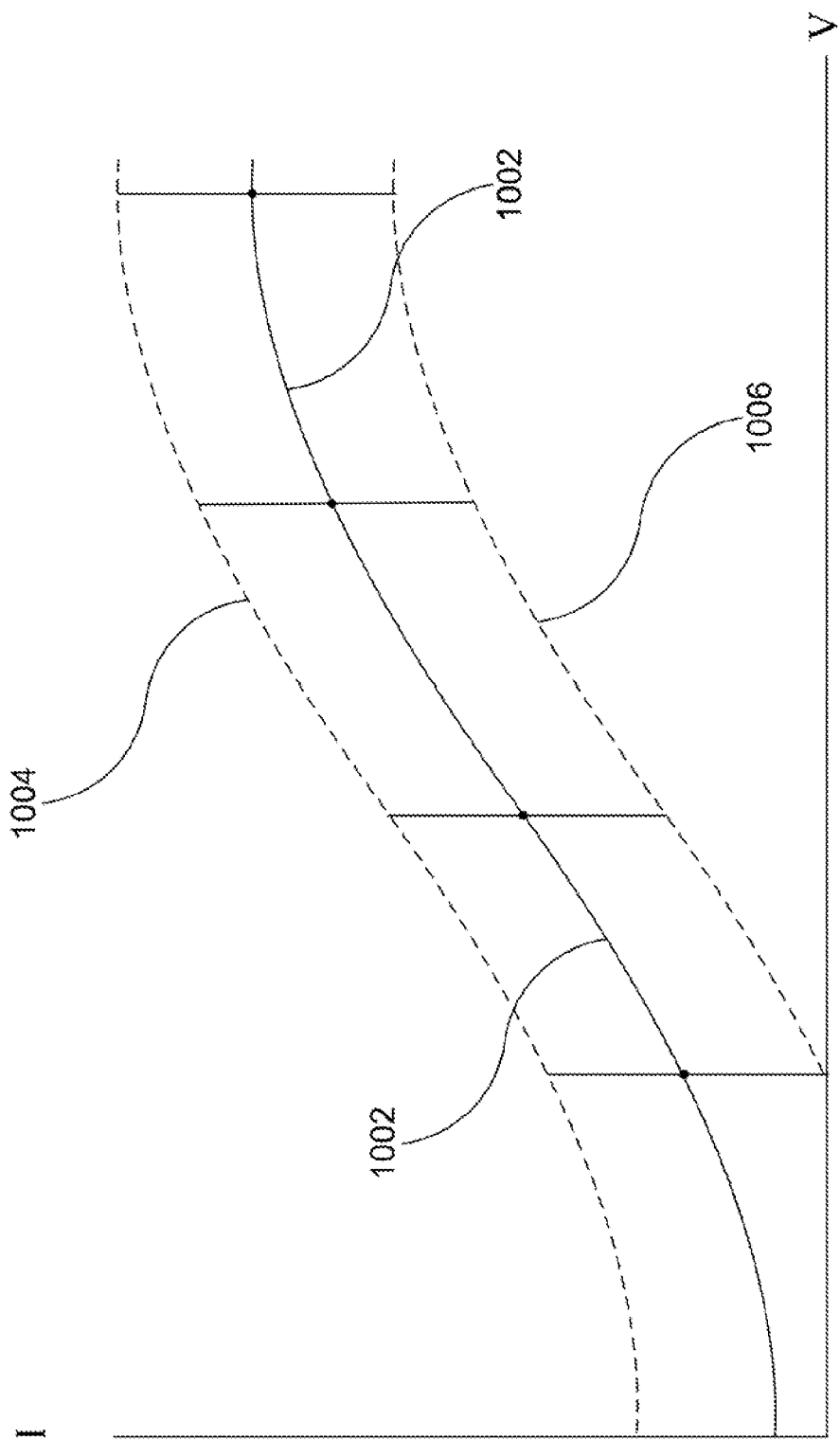
FIG. 10 is an illustrative diagram in which a conservative approximation of device I-V behavior is defined in terms of voltage offset from a curve representing an I-V relationship for a device.
Figure 11:
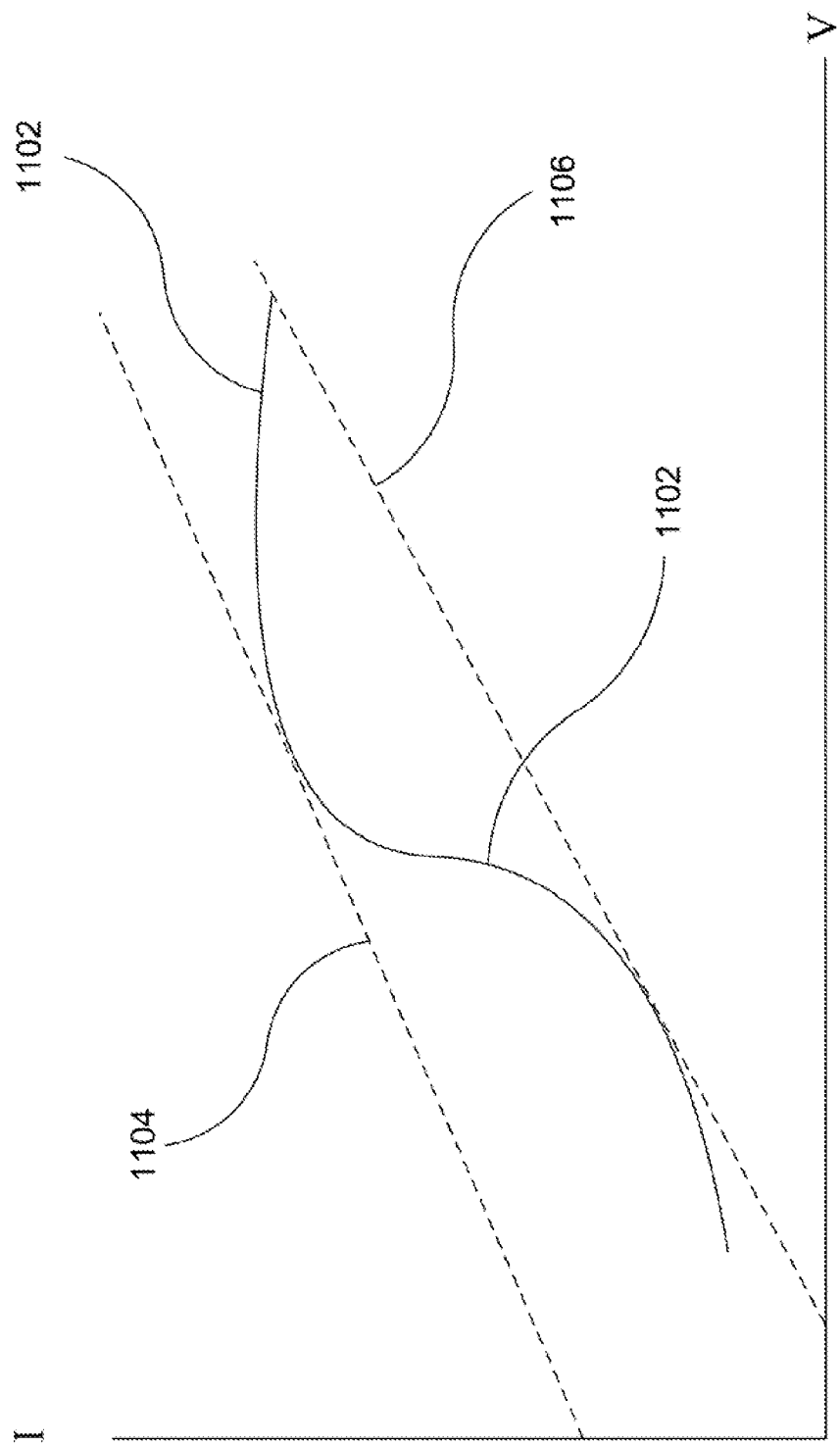
FIG. 11 is an illustrative diagram in which a conservative approximation of device I-V behavior is defined in terms of tangents to a curve representing an I-V relationship for a device.

While the above paragraphs describe conservative approximations in terms of ranges expressed as rectangular intervals, it will be appreciated that a conservative approximation of device behavior may take other forms. FIG. 10 is an illustrative diagram in which a conservative approximation of device I-V behavior is defined in terms of voltage offset from a curve representing an I-V relationship for a device. A device curve 1002 represents an I-V relationship for a first hypothetical device. An upper dashed line curve 1004 is offset 0.5 volts above the device curve 1002, and a lower dashed line curve 1006 is offset 0.5 volts below the device curve. In this example, the conservative approximation of device behavior is defined as the region between the upper and lower dashed line curves 1004 and 1006. FIG. 11 is an illustrative diagram in which a conservative approximation of device I-V behavior is defined in terms of tangents to a curve representing an I-V relationship for a device. A device curve 1102 represents an I-V relationship for a first hypothetical device An upper dashed line tangent curve 1104 is an upper tangent to the device curve 1102, and a lower dashed line tangent curve 1106 is a lower tangent to the device curve 1102. In this example, the conservative approximation of device behavior is defined as the region between the upper and lower dashed tangent line curves 1104 and 1106.

Setting-Up the Different Simulation Types

A SAT-based formulation in accordance with embodiments of the invention can be used to set up SPICE equivalents of DC, Transient and Periodic Steady State (PSS) simulations, for example.

DC Simulation

A DC simulation setup is quite straight-forward. The I-V tables for a devices are built using SPICE, for example. These tables can be pre-computed up to some specified level of granularity or can be evaluated on-the-fly using a device evaluator. The tables can be set up as constraints along with the KCL constraints. A SAT solver can be used to solve the combined constraint set to obtain a DC solution for the circuit. Remember that since the input to the solver was in the form of intervals, the output will also be a set of intervals. A solution interval set returned by the SAT solver means that there may exist some value within the range of intervals of the solution set for which the circuit has a real solution. The uncertainty comes because of over-approximations in setting up the conservative approximations that serves as constraints for the device I-V relationships. On the other hand, if the solver fails to come up with a solution in a given region, the real circuit, too, has no feasible solution in that region. For example, hypothetically speaking, a constraint may require that all transistors be in deep saturation, but this constraint may not be feasible for the circuit.

PSS Simulation

The DC simulation methodology can be extended to pose PSS (Periodic Steady State) simulations as a SAT problem as well. See, Kenneth S. Kundert, Jacob K. White, and Alberto Sangiovanni-Vincentelli, *Steady-State Methods for Simulating Analog And Microwave Circuits*. Kluwer Academic Publishers, Boston, 1990, for a discussion of simulations of periodic steady state circuits. PSS simulations capture only the steady-state behavior of circuits that exhibit periodic behavior. For example, an oscillator when powered on may exhibit some transient behavior, but, after a certain time point would produce a periodic waveform. The designers are often interested in this periodic response of the circuit that can be obtained through PSS analysis. There are other simulation scenarios, particularly for analyzing RF circuits like LNAs, etc., where PSS analysis is often useful. Normally, a PSS analysis returns the solution of the circuit at a fixed number (K) of (often equidistant) points within the given period.

In a methodology in accordance with some embodiments of the invention, for a K-point PSS simulation, K copies of the DC simulation equations are created—one for each time point. The KCL equations will have an extra term representing the current through the capacitors as shown in Eqn. 11.

$$i(v^j) + C \frac{v^j - v^{j-1}}{T/K} = 0 \quad (11)$$

Here v is the solution vector at time point $j (1 \leq j \leq K)$ and C is the capacitance matrix for the circuit. T is the time period of the circuit. K is the number of time steps. Also, $v^K = v^0$ is a boundary constraint. The time derivative of voltage in Eqn. 11 connects the solution of different time points with each other. The term T/K can be considered as the integration time step.

In the SAT model, the period of oscillation can be represented as an independent variable that also needs to be solved by the SAT solver (This model could be useful for simulating oscillators where one does not know the exact period.). Making T as a variable along with $v_j$ makes Eqn. 11 a quadratic equation. Quadratic equations are generally harder to solver than linear. Also, SMT solvers generally are not well developed for quadratic equations as the underlying theory. Therefore, in accordance with some embodiments of the invention, the equations are transformed to preserve the linear nature and so as to make them easier to solve. This solution is done by converting Equation 11 from an equality into a feasibility check—to check for the existence of some T within a range $T_{min}$ to $T_{max}$ for which the equation is satisfied. With this transformation, a search can be performed to find the oscillation period for which the circuit exhibits periodic behavior. For each node r in the circuit, Eqn. 11 can be replaced by a disjunction of two pairs of inequalities (Eqn. 12 and Eqn. 13), to check if a periodic solution exists for the circuit for time period (T) between $T_{min}$ and $T_{max}$. Eqn. 12 holds if $C_r (v^j - v^{j-1}) \geq 0$, while Eqn. 13 holds if $C_r (v^j - v^{j-1}) < 0$.

$$i_r(v^j) C_r \frac{v^j - v^{j-1}}{T_{min}/K} \geq 0 \ \& i_r(v^j) + C_r \frac{v^j - v^{j-1}}{T_{max}/K} \leq 0 \quad (12)$$

$$i_r(v^j) + C_r \frac{v^j - v^{j-1}}{T_{max}/K} \geq 0 \ \& i_r(v^j) + C_r \frac{v^j - v^{j-1}}{T_{min}/K} \leq 0 \quad (13)$$

If the PSS constraints hold (KCL and current equations hold and solution at t=0 is the same as solution at t=T) for that particular range, we refine further, else, we know that the period of the circuit does not lie within the specified range. After finding a range for a time period for which the PSS constraints hold, we can find the voltage values at the different nodes in the circuit at each time point.

Transient Simulation

SAT formulation for transient simulation is similar to the PSS formulation (Eqn. 11) except that there is no need to add the periodicity condition as shown in Eqn. 14. In the equation, $\Delta T$ is the integration time-step. The value $v^j$ is the solution vector at time point j. C is the capacitance matrix.

$$i(v^j) + C \frac{v^j - v^{j-1}}{\Delta T} = 0 \quad (14)$$

Note that the formulation of Eqn. 11 and Eqn. 14 represents an implicit set of equations. These equations can be transformed into an explicit set. Generally, implicit methods are attractive mechanisms for solving stiff equations (equations with very different time constants) that are easily found in circuit simulation problems. In such cases, explicit methods perform poorly. Also, these equations can be changed to support any multi-step integration scheme. For a P step integration scheme, the Eqn. 14 would appear in the following form with αP and βP being constants:

$$\sum_{p=0}^{P} \alpha_p i(v^{j-p}) + C \sum_{p=0}^{P} \beta_p v^{j-p} = 0 \qquad (15)$$

In equation 15, we are trying to find the solution at time step j by approximating the derivatives using the solutions at the previous P time steps.

It will be appreciated that the absence of a solution provided by the SAT solver for any of our dynamic formulations (Eqn. 11, 12, 13, 14, and 15) means that there does not exist a solution for the original circuit if it were modeled using the said equations. This does not preclude the existence of a solution which may be found using a different time step or integration scheme. However, from a practical perspective, the proposed approach does solve the problem that designers care about—that of finding failing conditions for their circuit (assuming some fixed integration scheme).

Practical Implementation Issues

Handling Exponentials

The range of problems that can be formulated using a SAT-based verification methodology in accordance with some embodiments of the invention includes a sub-class of problems that are well known to exhibit exponential complexity, for example, path-based STA (Static Timing Analysis). Thus, it is not so difficult to formulate problems within the SAT-based verification framework described herein that would have exponential run-time complexity. However, there is a large class of useful problems that can be solved without exercising the exponential run-times.

Boolean satisfiability solvers are known to attempt to solve NP-complete problems. Solving these problems, in their worst case, would take time which is exponential in the number of variables to solve. Practical implementations of these solvers, though, often avoid hitting the exponential complexity on a large range of practical problems. However, there is nothing that guarantees that the solvers will not face this worst case scenario. Since embodiments of the invention use a SAT (or SMT) engine as the underlying solver, our formulation also faces the problem of hitting exponential run times, though, hopefully, in rare circumstances. Therefore, care should be taken to avoid posing the verification problem in such a way that exercises the exponential complexity.

Figure 12:
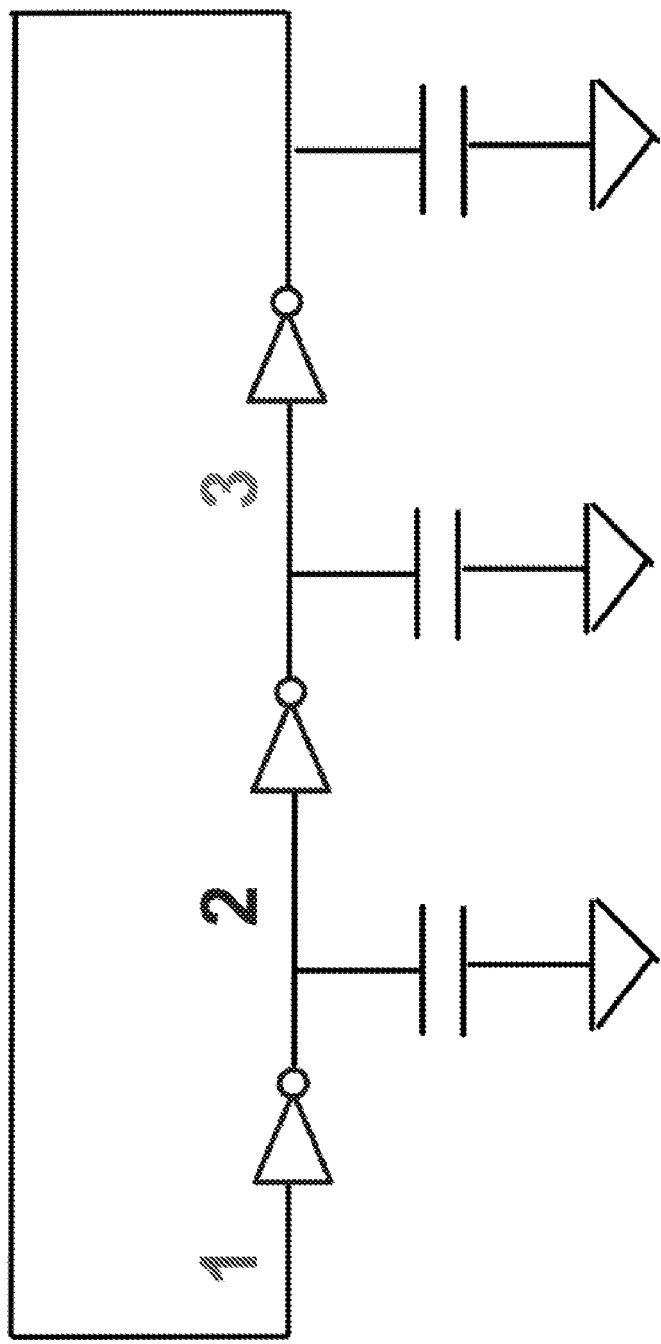
FIG. 12 is an illustrative schematic drawing of a three inverter ring oscillator.
Figure 13:
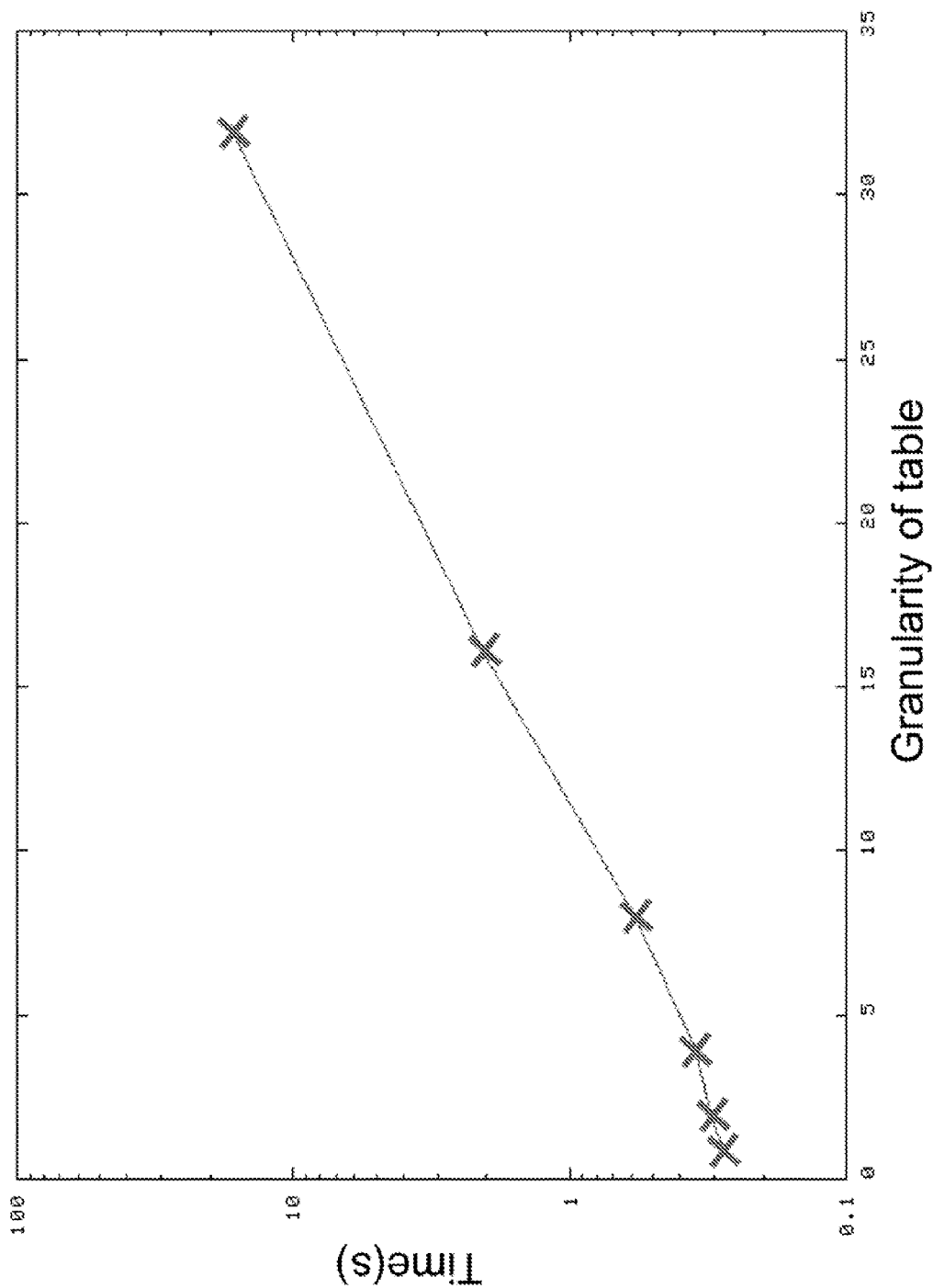
FIG. 13 is an illustrative graph showing exponential run time as a function of the granularity of an I-V table for the three inverter ring oscillator circuit of FIG. 12.

FIG. 12 is an illustrative schematic drawing of a three inverter ring oscillator. FIG. 13 is an illustrative graph showing exponential run time as a function of the granularity of an I-V table for a three inverter ring oscillator circuit of FIG. 12, for example. As can be seen form the graph, the run time for solving the circuit equation grows exponentially with the granularity of the underlying table for the MOS devices. Hence, throwing a flat fine grained I-V table to the SAT solver is not a very good idea because there are no relationships between the different rows that the SAT solver can deduce from the table. Thus, the solver would have to try all permutations of the different rows for all the devices to check whether there exists one such permutation that satisfies all the constraints. It would be very helpful for the solver if it could deduce information such as: there won't be solutions where V1 is in between 0.0 and 0.4 volts so that the solver does not spend large amounts of time exploring each fine grained division for VI in between 0.0 and 0.4 volts, for example. One way of helping the solver learn the relationship is to introduce hierarchical constraints. As an example, a constraint of the form $$((0.0 < V1 \leq 0.1) \Rightarrow (1\,\mu A < I1 \leq 2\,\mu A))\,\&$$

$$((0.1 < V1 \leq 0.2) \Rightarrow (2\,\mu A < I1 \leq 4\,\mu A)) \qquad (16)$$

could be represented as $$((0.0 < V1 \leq 0.2) \Rightarrow (1\,\mu A < I1 \leq 2\,\mu A))\,\&$$

$$((0.0 < V1 \leq 0.1) \Rightarrow (1\,\mu A < I1 \leq 2\,\mu A))$$

$$((0.1 < V1 \leq 0.2) \Rightarrow (2\,\mu A < I1 \leq 4\,\mu A))$$

Figure 14A:
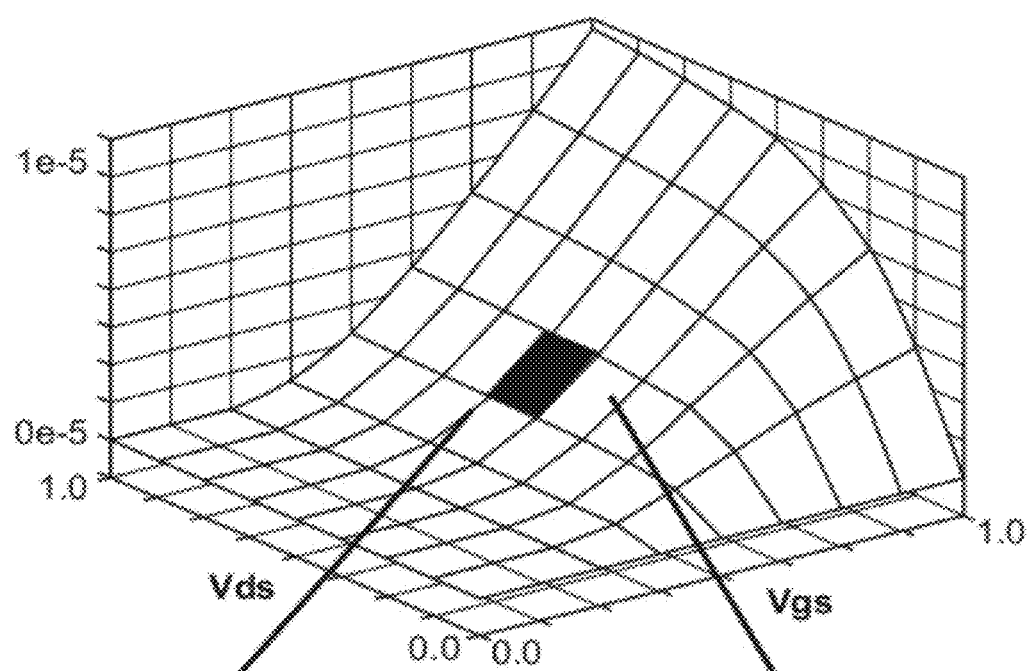
Figure 14B:
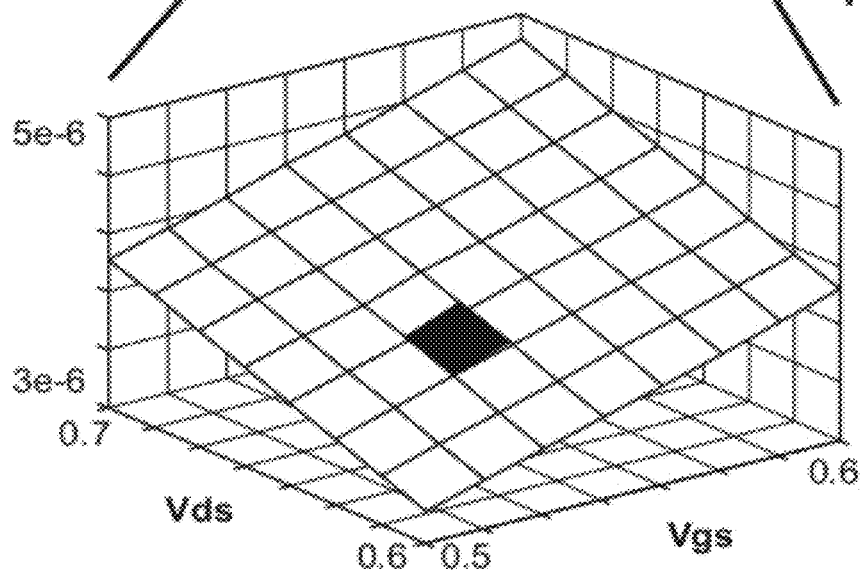

Another approach is to apply the same idea of hierarchical constraint but in an implicit way using abstraction refinement. FIGS. 14A-4B are illustrative graphical representations of a coarse grained table (FIG. 14A) that is refined to a less coarse grained table (FIG. 14B) The coarse grain table of FIG. 14A sets forth conservative approximations representing a nonlinear I-V relationship. Once the SAT-solver finds a solution for the coarse grained problem (the shaded region of FIG. 14A) the conservative approximations are defined to represent the I-V table only within this (shaded) region, and the SAT-solver then re-solves the problem to get a finer grained solution.

Decision Procedure Vs Exhaustive Solution

The SAT-based simulation formulation in accordance with some embodiments of the invention can be used both as a mechanism for obtaining exhaustive solutions (where it is used to replicate SPICE by enumerating all possible solutions satisfying the constraints fed to the solver) or as a decision procedure (which simply gives a yes/no answer on where the constraints can be satisfied or not). There are practical implications that should be kept in mind for using the methodology in either of these forms. As a decision procedure, the job of the solver is much easier as it just needs to provide a "yes" answer as soon as it finds the very first scenario for which all the constraints are specified or a "no" if it fails to find one. However, this mode of using the tool generally is most useful in situations where the constraints are very tight and the designer is searching for one or very few failure scenarios. On the other hand, from a circuit designer perspective, an exhaustive solution mode can be quite useful as the tool would provide ranges of solution sets that are feasible, thereby providing much insight into the functioning of the circuit. However, this approach comes at a cost of increased run times and possible difficulty in presenting large amounts of solution data in a meaningful way.

Experimental Results

We implemented the methodology presented above into our tool called fSpice (formal SPICE). fSpice can read in a limited version of standard Spectre netlist. It has a small language to add in additional constraints. It uses a SMT solver called "Yices" as its underlying SAT engine. The results below test the applicability of our proposed methodology using some pruned versions of circuits that had difficulties during tape-out. The transistor models that were used for the circuits were 90 nm BSIM4 models. The Vdd and Vss values for all the designs were 1.0 and 0.0, respectively.

DC Analysis

Figure 15B:
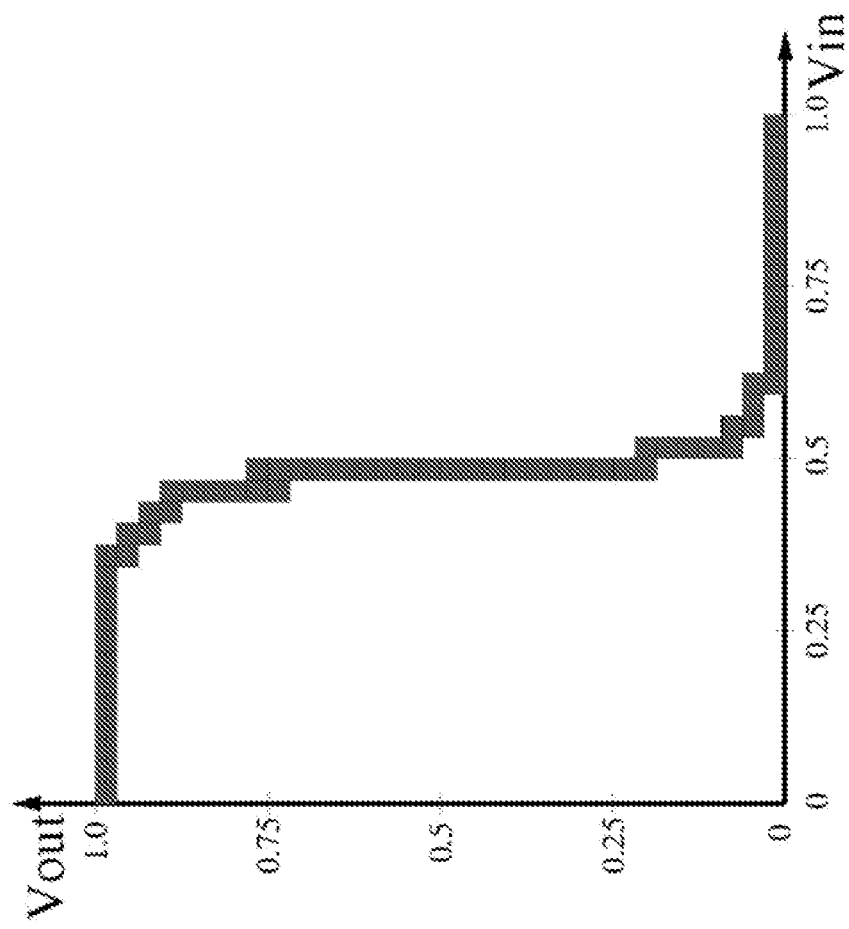
FIGS. 15A-15B is an illustrative transistor level drawing of an inverter (FIG. 15 A) and a conservative approximation (FIG. 15B) of an I-V input-output characteristics of the inverter circuit as generated in accordance with some embodiments of the invention.
Figure 15A:
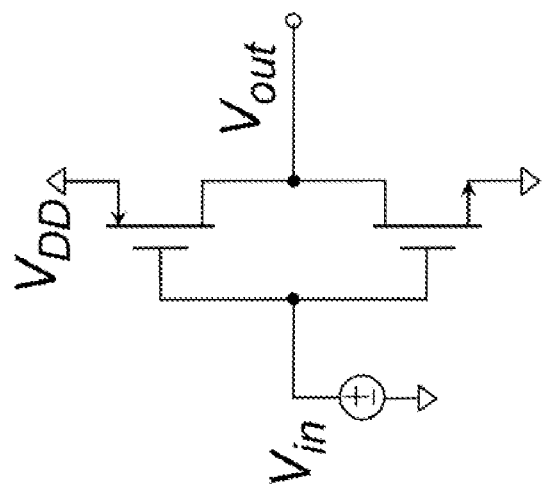

FIGS. 15A-15B is an illustrative transistor level drawing of an inverter (FIG. 15 A) and a conservative approximation (FIG. 15B) of an I-V input-output characteristics of the inverter circuit as generated in accordance with some embodiments of the invention. In particular, we generated the output characteristic using the tool that we call fSpice that performs processes according to embodiments of the invention. We determined an I-V relationship for the inverter circuit (not shown) and applied the techniques described herein for embodiments of the invention to compute the I-V conservative approximation for the inverter circuit. A conservative approximation of the I-V relationship comprising 32 I-V tables, was generated with the voltage variables divided into 32 intervals. As can be seen from FIG. 15B, there are regions where an input within a given interval produces outputs spanning multiple intervals. This result is expected because, in the transition region of the curve, a small change in the input produces large changes in the output for the inverter. In FIG. 15B, there are also situations when a given output interval range is predicted by multiple input intervals. Given the conservative nature of the tables, some of those intervals will not yield a solution on further refinement.

Figure 16:
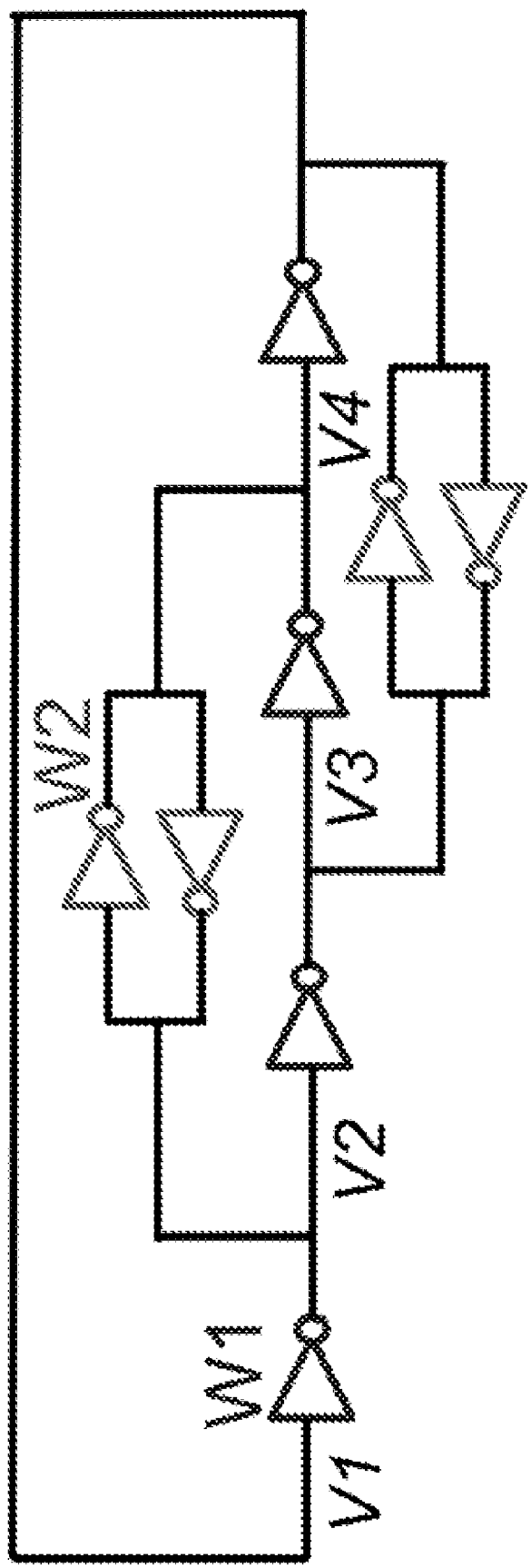
FIG. 16 is an illustrative schematic diagram of a quadrature phase ring oscillator circuit.

FIG. 16 is an illustrative schematic diagram of a quadrature phase ring oscillator circuit. In another example, we queried DC simulation related properties for the oscillator circuit. The circuit has chains of even and odd number of inverters. Because of this unique design, the circuit either oscillates or latches to a stable value depending upon the strength of the inverters. The circuit of FIG. 16 oscillates for a particular range of values of W1/W2. In cases when either W1<<W2 or W2<<W1, one of the even inverter chains becomes strong and the circuit latches to a stable solution. Our SAT formulation had the table representation for the devices that included $I_{ds}$ as a function of $V_{gs}$, $V_{ds}$ and widths (W) of the transistors. It also had the KCL equations represented as constraints. For generating the tables, the voltage values were divided into 8 intervals. We did not apply abstraction refinement for this particular example and the complete set of constraints were solved directly by the SMT solver. We added extra constraints like $(0.0 \leq V1 \leq 0.2) \& ((0.8 \leq V2 \leq 1.0) || (0.8 \leq V3 \leq 1.0))$. These extra constraints forced the SAT solver to only find circuit instances which have at least one stable solution.

Figure 17:
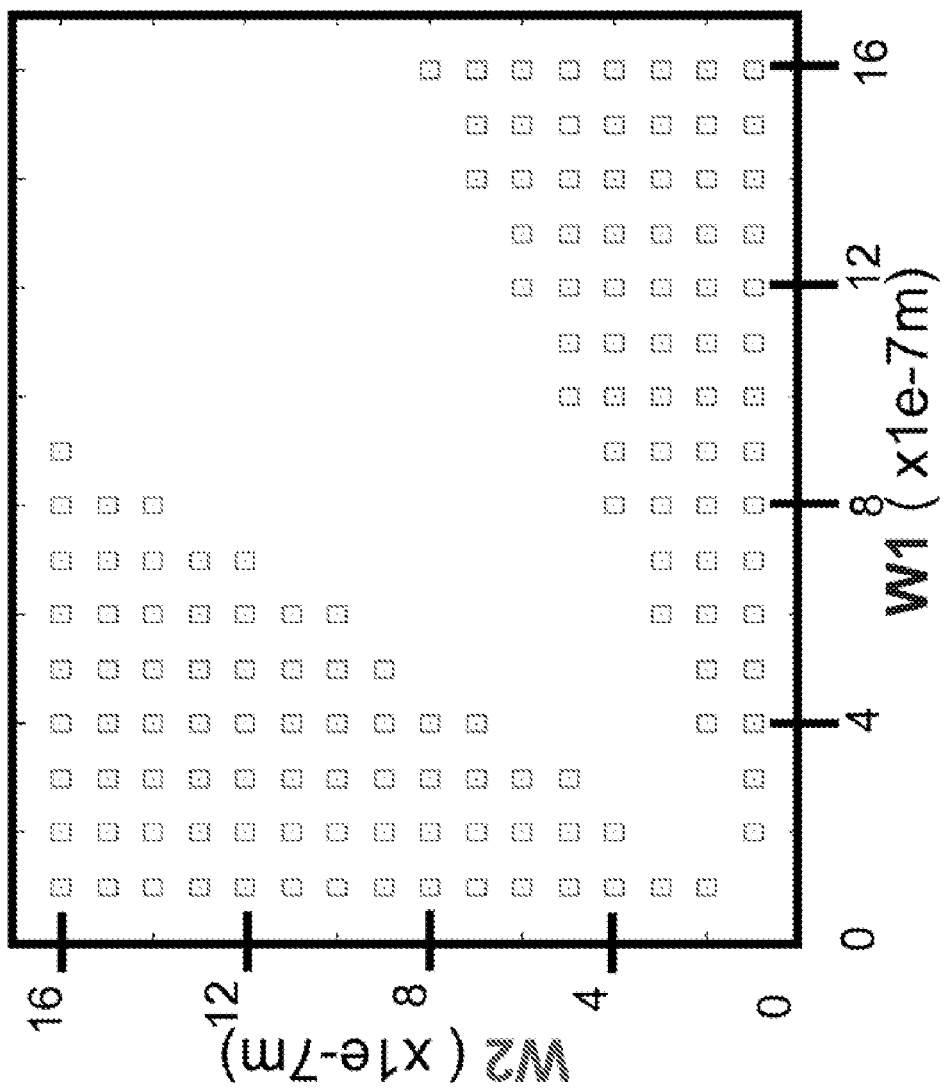
FIG. 17 is an illustrative drawing showing results produced by a SAT solver for the circuit of FIG. 16 in accordance with some embodiments of the invention.

FIG. 17 is an illustrative drawing showing results produced by a SAT solver for the circuit of FIG. 16 in accordance with some embodiments of the invention. The diagonal white regions represent the values of W1 and W2 for which the solver could not find a stable solution. Due to our conservative approximation based modeling methodology we guarantee, in the formal verification sense, that no stable solution for the real circuit lies within this region. (This was verified through simulation.) On the other hand, since our table based model is an approximation of the underlying I-V relationships, we cannot guarantee the existence of a solution at each of the squares. These square regions could be further explored (via abstraction refinement) to check for a real solution by refining the tables for each of these regions.

Figure 18:
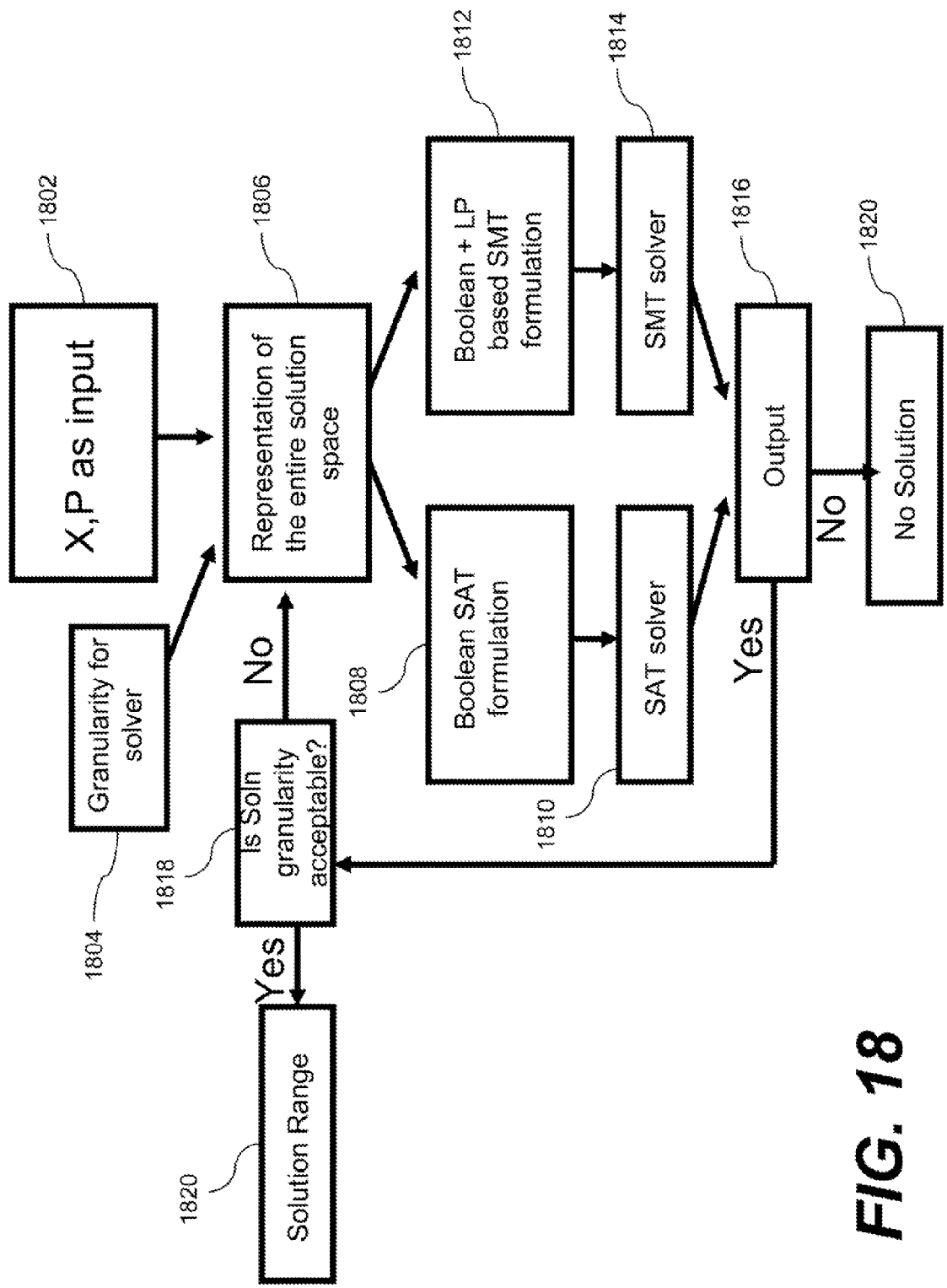
FIG. 18 is an illustrative flow diagram of a SAT-based verification process 1800 that involves abstraction refinement in accordance with some embodiments of the invention.

FIG. 18 is an illustrative flow diagram of a SAT-based verification process 1800 that involves abstraction refinement in accordance with some embodiments of the invention. Computer program instructions encoded in a computer readable medium (not shown) are used to program a computer system (not shown) to implement the process 1800. Input block 1802 provides constraints (e.g. V, I, X). Input block 1804 provides a granularity for the solver. Block 1806 provides a representation of the entire solution search space. The search space defined in terms of formulation comprising the input constraints at the input granularity. The two flow paths comprising a first path that comprises block 1808 and block 1810 and a second path that comprises block 1812 and block 1814 correspond to alternative solvers. In the first path, block 1808 provides a Boolean SAT formulation to a block 1810, which employs a SAT solver. In the second path, block 1812 provides a Boolean+LP based SMT formulation to a block 1814, which employs a SMT solver. If the solver (whichever actually is employed, either SAT or SMT) provides to first decision block 1816 a result indicative that a solution exists ("yes"), then flow proceeds to second decision block 1818, which determines whether the solution granularity is acceptable. If the level of granularity is not acceptable then second decision block 1818 returns the process returns to block 1806, and the search space is re-defined in terms of formulation comprising a new set of input constraints at a new input granularity, and the cycle repeats. If the level of granularity is acceptable then second decision block 1818 provides an output to block 1820 indicative of the solution range. If the solver provides to first decision block 1816 a result indicative that a solution does not exist ("no"), then the search is complete, and the process ends at block 1820.

Experimental Example of Abstraction Refinement Applied to a Three Inverter Ring Oscillator The widths of the inverters in the three stage ring oscillator chain of FIG. 12 were fixed, and abstraction refinement was applied to find a fine-grained solution set for the circuit. I-V tables were produced by dividing the independent voltage values into 64 intervals. However, initially a table was provided with only two coarse intervals for each independent variable (one from 0.0-0.5 V and another from 0.5-1.0 V). On finding a solution for any of these coarse grained intervals, that interval was divided into two and recursed a solution was found at the finest resolution $$\left(\frac{1}{64}\right)$$

provided.

Figure 19:
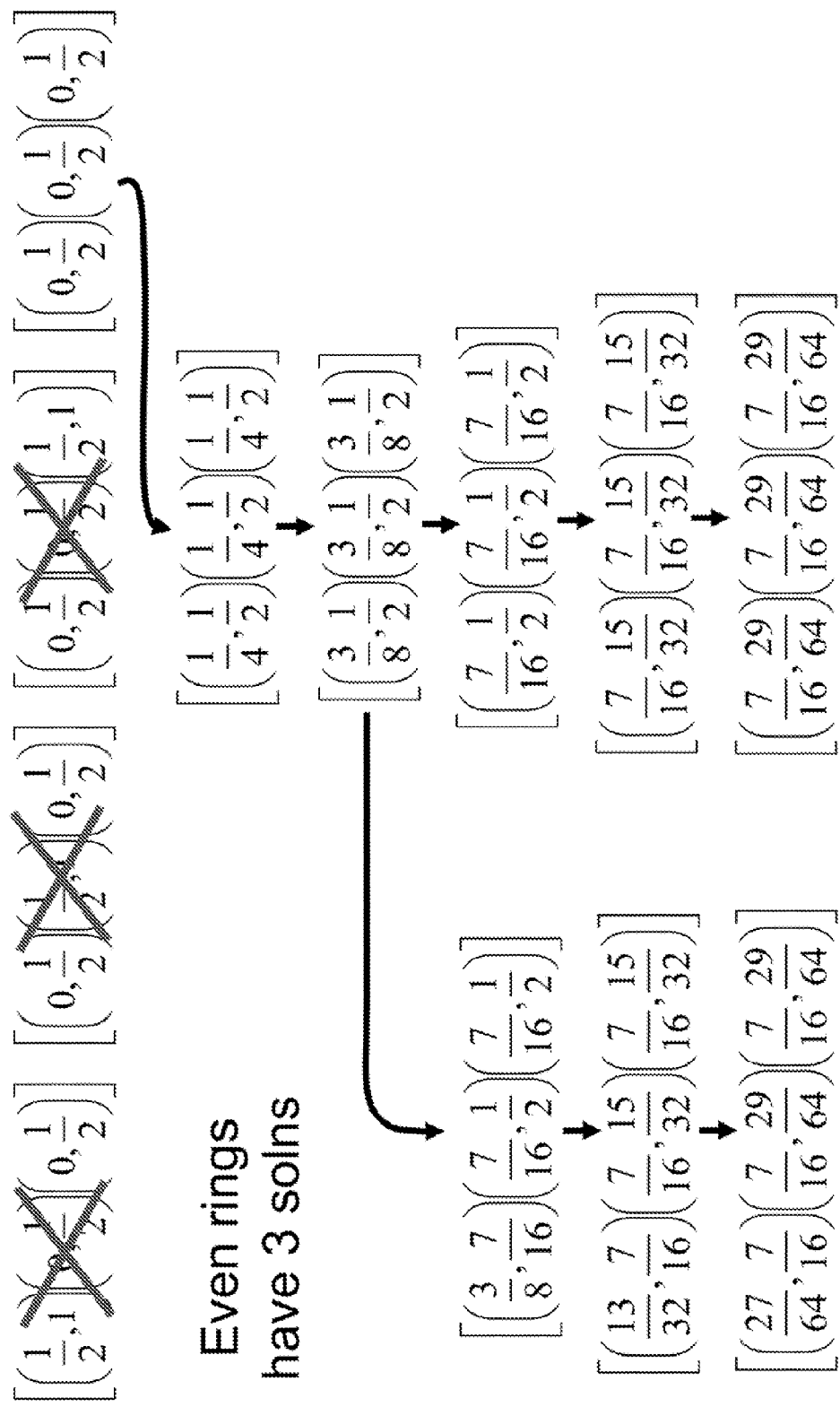
FIG. 19 is an illustrative drawing showing the solution sets for the oscillator circuit of FIG. 12 at each stage of abstraction refinement in accordance with some embodiments of the invention.

FIG. 19 is an illustrative drawing showing the solution sets for the oscillator circuit of FIG. 12 at each stage of the example abstraction refinement. The entries with the square brackets form a solution set for nodes V1, V2 and V3 of the oscillator. The solution sets in a row are the solution at a specific level of granularity of the table.

Figure 20A:
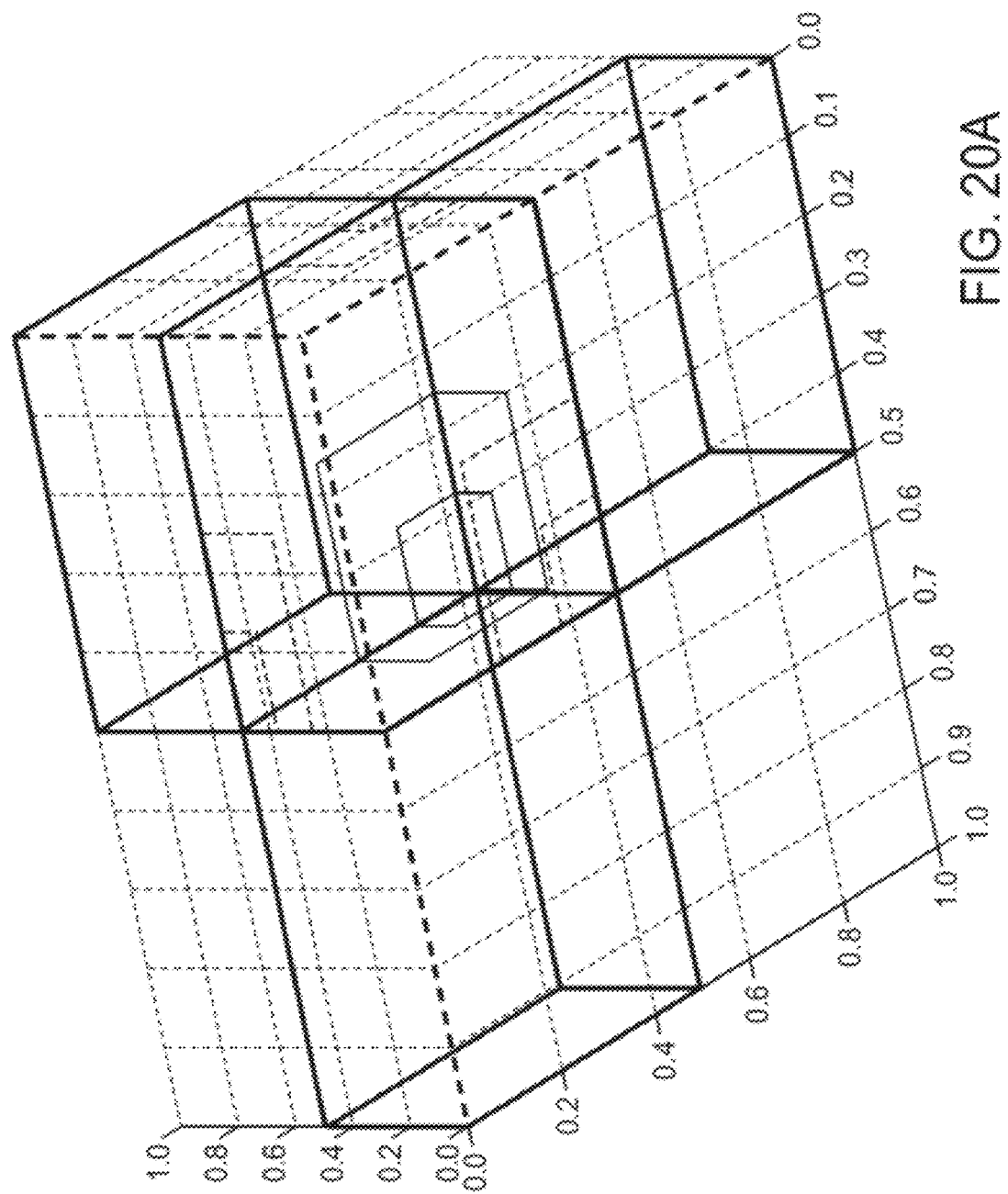
FIGS. 20A-20C are an illustrative drawings graphically representing the solution set of FIG. 19.
Figure 20B:
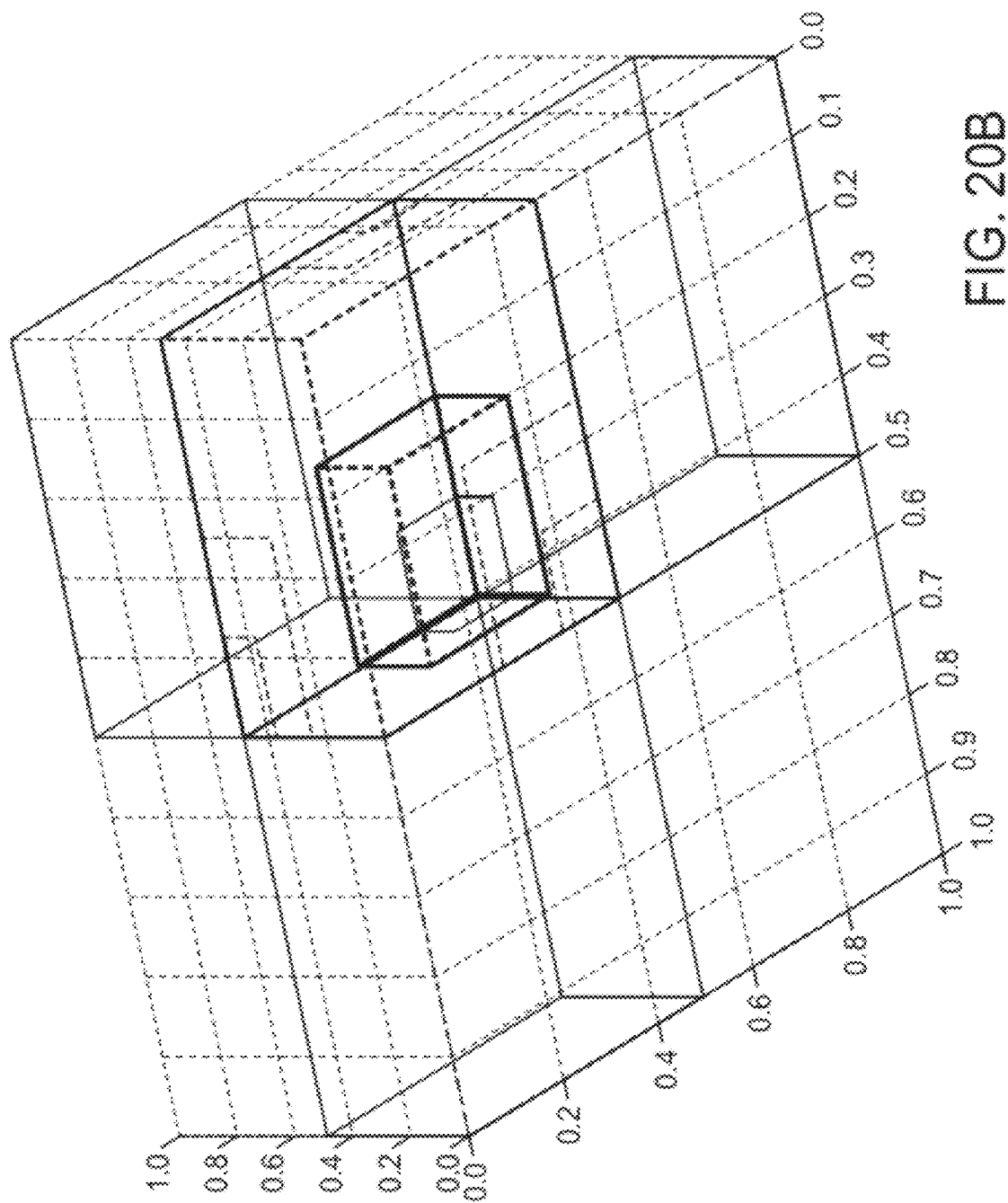
Figure 20C:
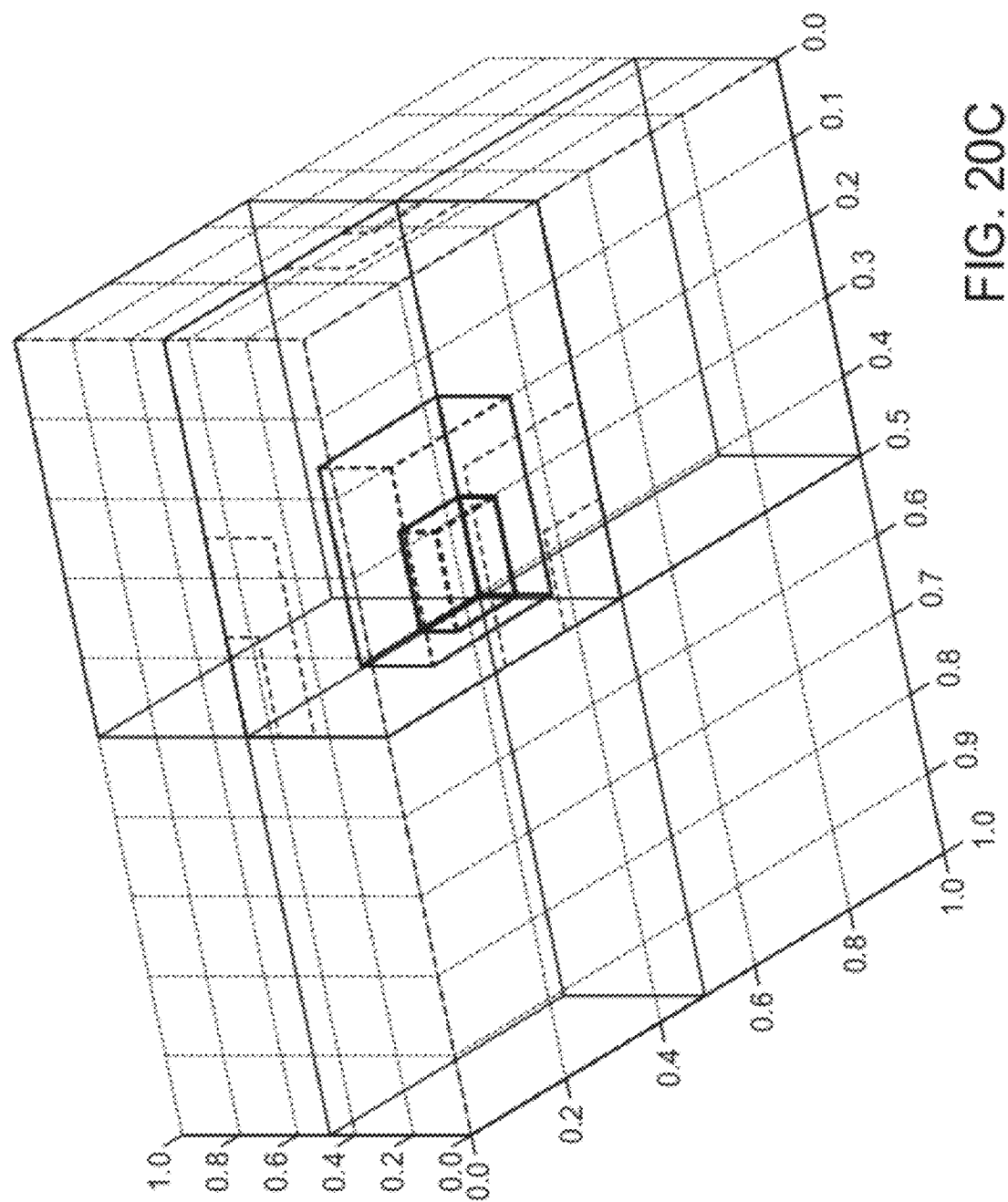

FIGS. 20A-20C are an illustrative drawings graphically representing the solution set of FIG. 19. The three axes in FIGS. 20A-20C correspond to the three voltage nodes of the circuit of FIG. 12. Note that projections on the three axis are shown with dashed lines. Thus, the information in FIG. 19 is pictorially represented as volumes in FIGS. 20A-20C. The solutions for resolutions $$\frac{1}{2}, \frac{1}{4}, \text{ and } \frac{1}{8}$$

are shown in 20A-20B, and the solutions for resolutions $$\frac{1}{8}, \frac{1}{16}, \frac{1}{32}, \text{ and } \frac{1}{64}$$

are shown in FIGS. 20 B-20C (at an enlarged scale). Clearly, at each refinement a new volume is obtained that is fully contained in the previous one. In FIGS. 20A-20C, projections of the various volumes are represented on the three orthogonal planes, to help visualize the relative positions in 3-D.

Of all the topmost feasible solution sets, only solution $$\left[\left(0, \frac{1}{2}\right], \left(0, \frac{1}{2}\right], \left(0, \frac{1}{2}\right]\right]$$

contains non-empty solution sets once refined to finer granularity.

As can be seen from the FIGS. 20A-20C, all DC solutions for the oscillator are clustered around $$\frac{7}{16}$$

Vdd, which is very close to Vdd/2 as one would normally expect.

Thus, it will be appreciated that one advantage of the use of SAT-based formulation for solving circuit simulation problems in accordance with some embodiments of the invention, is that, unlike SPICE, which typically returns one local solution for a simulation problem, SAT can return all possible solutions. Once the SAT solver returns a solution to the set of constraints, an extra constraint can be added stating that the solution should not be the one that was just returned by the SAT solver. This approach would force the solver to look for other solutions. This process can until the solver returns an "unsat" which means that there are no further feasible solution sets.

Processing Environment

Figure 21:
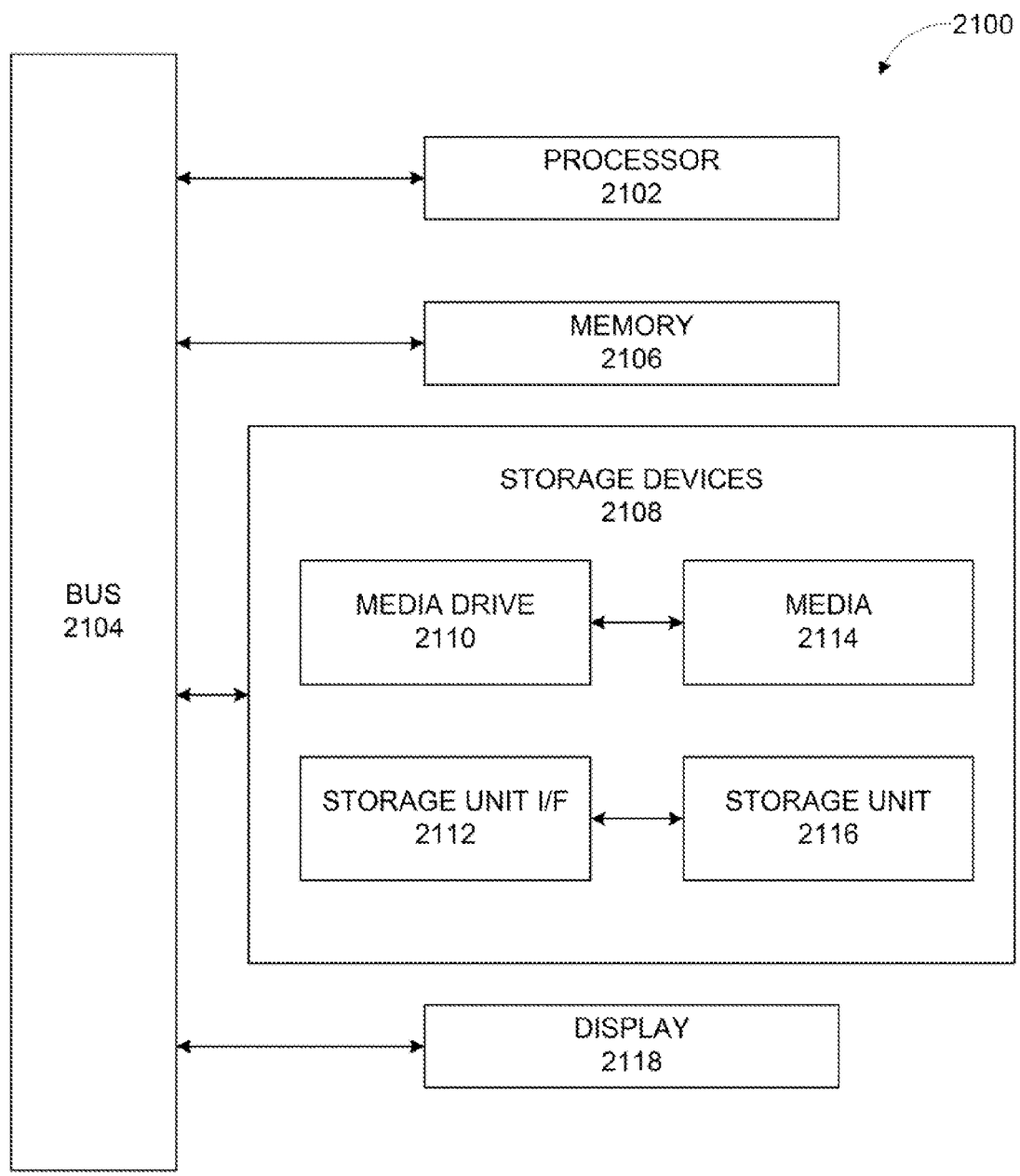
FIG. 21 is an illustrative block level diagram of a computer system that can be programmed to perform Boolean satisfiability based analysis in accordance with some embodiments of the invention.

FIG. 21 is an illustrative block level diagram of a computer system 2100 that can be programmed to perform Boolean satisfiability based analysis in accordance with some embodiments of the invention. Computing system 2100 also can include a main memory 2106, preferably random access memory (RAM) or other dynamic memory, for saving information such as, SMT-linear or SMT-quadratic expressions and for storing computer program instructions, such as code to perform SAT searches and/or SMT searches and abstraction refinement. Main memory 2106 also may be used for storing temporary variables or for buffering other intermediate information such as intermediate search results information during execution of instructions to be executed by processor 2102. Computer system 2100 can likewise include a read only memory ("ROM") or other static storage device coupled to bus 2104 for storing static information and instructions for processor system 2102. Moreover, the main memory 2106 and the persistent storage devices 2108 may store data such as device model information or a computer program process such as an SAT solver or SMT solver, for example.

The persistent storage devices 2108 may include, for example, a media drive 2110 and a storage interface 2112. The media drive 2110 can include a drive or other mechanism to support storage media 2114. For example, a hard disk drive, a floppy disk drive, a magnetic tape drive, an optical disk drive, a CD or DVD drive (R or RW), or other removable or fixed media drive. Storage media 2114, can include, for example, a hard disk, a floppy disk, magnetic tape, optical disk, a CD or DVD, or other fixed or removable medium that is read by and written to by media drive 2q10. Information storage mechanism 2108 also may include a storage unit 816 in communication with interface 2112.

The (one or more) processors 2102 may be programmed using a simulation program to perform simulations of an integrated circuit design. Simulation results in the form of multi-thread streaming data are temporarily buffered in memory 2106. The computer system 2100 also includes a user interface (UI) display unit 2118 that can be used to display information such as SAT/SMT solver results.

In this document, the terms "computer program medium" and "computer useable medium" are used to generally refer to media such as, for example, memory 2106, storage devices 2108, a hard disk installed in hard disk drive 2110. These and other various forms of computer useable media may be involved in carrying one or more sequences of one or more instructions to processor 2102 for execution. Such instructions, generally referred to as "computer program code" (which may be grouped in the form of computer programs or other groupings), when executed, enable the computing system 2100 to perform features or functions of the present invention as discussed herein.

It will be understood that the foregoing description and drawings of preferred embodiment in accordance with the present invention are merely illustrative of the principles of this invention, and that various modifications can be made by those skilled in the art without departing from the scope and spirit of the invention.

The invention claimed is:

1. A method to formally verify a property of a circuit design comprising:
    receiving a description of at least a portion of the circuit that identifies one or more devices that each includes at least one terminal and that identifies at least one connection between terminals of one or more of the identified devices;
    receiving a description of a relationship between current values and voltage values represented as a curve (I-V curve relationship) for one or more of the identified devices;
    converting each respective I-V curve relationship to multiple respective conservative approximations, each representing a respective portion of such respective I-V curve relationship as an interval that includes a range of one of current values or voltage values that implies an interval that includes a range of the other of current values or voltage values and that encompasses the respective portion of the respective I-V curve relationship;
    assigning voltage labels to one or more terminals of one or more identified devices that indicate voltage relationships among the one or more terminals consistent with KVL;
    defining a respective current relationship, among one or more respective sets of currents of the one or more of the identified devices that have one or more terminals that the circuit description indicates to have a connection between them, that is consistent with KCL; and
    using a computer to search a search space defined by the respective conservative approximations for a region of the search space that is bounded by a range of current and a range of voltage values that intersects with a respective conservative approximation of a respective portion of each respective I-V curve relationship and that is consistent with the voltage labels and that is consistent with each respective defined current relationship.

2. The method of claim 1 further including:
defining at least one constraint upon a property of at least one of the devices;
wherein searching includes searching for a region of the search space that is bounded by a range of current values and a range of voltage values that also satisfies the at least one constraint.

3. The method of claim 1 further including:
defining at least one constraint upon a physical dimension property of at least one of the devices;
wherein searching includes searching for a region of the search space that is bounded by a range of current values and a range voltage of values that also satisfies the at least one constraint.

4. The method of claim 1 further including:
defining at least one constraint upon an electrical property of at least one of the devices;
wherein searching includes searching for a region of the search space that is bounded by a range of current values and a range of voltage values that also satisfies the at least one constraint.

5. The method of claim 1 further including:
defining at least one constraint upon an environmental property of at least one of the devices;
wherein searching includes searching for a region of the search space that is bounded by a range of current values and a range of voltage values that also satisfies the at least one constraint.

6. The method of claim 1,
wherein converting includes formulating at least one SMT-LP expression that represents a region of a conservative approximation.

7. The method of claim 1,
wherein converting includes formulating at least one SMT-quadratic expression that represents a region of a conservative approximation.

8. The method of claim 1,
wherein converting includes formulating at least one hierarchical expression that represents a respective conservative approximation.

9. The method of claim 1 further including:
receiving an indication of an analysis;
wherein defining a respective current relationship includes defining relationships consistent with the indicated analysis.

10. The method of claim 1 further including:
receiving an indication of a DC analysis;
wherein defining a respective current relationship includes defining relationships consistent with DC analysis.

11. The method of claim 1 further including:
receiving an indication of a transient analysis;
wherein defining a respective current relationship includes defining relationships consistent with transient analysis.

12. The method of claim 1 further including:
receiving an indication of a PSS analysis;
wherein defining a respective current relationship includes defining relationships consistent with PSS analysis.

13. The method of claim 1,
wherein receiving a description of a relationship between current and voltage (I-V relationship) for one or more of the identified devices includes receiving the description from device models.

14. The method of claim 1,
wherein receiving a description of a relationship between current and voltage (I-V relationship) for one or more of the identified devices includes receiving information from measurements of physical devices.

15. The method of claim 1,
wherein the respective multiple respective conservative approximations include different regions defined by different non-overlapping ranges of current values and voltage values.

16. The method of claim 1,
wherein searching involves use of a SAT solver.

17. The method of claim 1,
wherein searching involves use of an SMT solver.

18. The method of claim 1 further including:
receiving an indication of error tolerance criteria;
wherein searching includes until regions are obtained that meet the error tolerance criteria.

19. The method of claim 1,
wherein converting each respective I-V relationship to multiple respective conservative approximations, each representing a portion of a respective I-V curve relationship includes defining multiple regions within each conservative approximation, each such region associated with a different range of voltage values; and
wherein searching further includes searching to identify a combination of defined regions that includes at least a portion of a defined region for a portion of every I-V curve and in which the defined regions in such identified combination have overlapping voltage ranges.

20. The method of claim 19 further including:
converting each combination of defined regions identified during the search to multiple sub-regions within such defined region, each such sub-region associated with a different non-overlapping sub-range of the voltage values of such defined region; and
wherein searching further includes searching for a combination of sub-regions that includes a sub-region for a portion of every I-V curve and in which the sub-regions in such combination are associated with overlapping sub-voltage ranges.

21. The method of claim 20 further including:
converting each sub-region identified during the search to multiple new sub-regions within such sub-region, each such new sub-region associated with a different non-overlapping smaller sub-range of the voltage values of such sub-region; and
wherein searching further includes searching for a combination of new sub-regions that includes a new sub-region for a portion of every I-V curve and in which the new sub-regions in such combination are associated with overlapping new sub-voltage ranges.

22. The article of claim 1,
wherein at least one respective conservative approximation includes different regions defined by different non-overlapping ranges of current values and values.

23. The article of claim 1,
wherein searching involves use of a SAT solver.

24. A method to formally verify a property of a circuit design comprising:
receiving a description of at least a portion of the circuit that identifies one or more devices that each includes at least one terminal and that identifies at least one connection between terminals of one or more of the identified devices;

receiving an indication of search accuracy criteria;

receiving a description of a relationship between current values and voltage values represented as a curve (I-V curve relationship) for one or more of the identified devices;

converting each respective I-V curve relationship to multiple respective conservative approximations, each representing a respective portion of such respective I-V curve relationship as an interval that includes a range of one of current values or voltage values that implies an interval that includes a range of the other of current values or voltage values and that encompasses the respective portion of the respective I-V curve relationship;

assigning voltage labels to one or more terminals of one or more identified devices that indicate voltage relationships among the one or more terminals consistent with KVL;

defining a respective current relationship, among one or more respective sets of currents of the one or more of the identified devices that have one or more terminals that the circuit description indicates to have a connection between them, that is consistent with KCL;

using a computer to search a search space defined by the respective conservative approximations to identify one or more respective regions of the search space that are bounded by respective ranges of current values and respective ranges of voltage values that intersect with a respective conservative approximation of a respective portion of each respective I-V curve relationship and that are consistent with the voltage labels and that are consistent with each respective defined current relationship;

converting each respective region identified during the search to multiple respective smaller regions within such region, each such smaller region associated with a respective smaller range of the voltage values of such identified region;

repeating the acts of searching and converting until identified regions are obtained that meet the received search accuracy criteria.

25. The method of claim 24, wherein converting each I-V relationship to multiple respective conservative approximations includes defining one or more constraints upon current and voltage (I-V constraints) for each such I-V relationship, each such I-V constraint defining respective regions of one or more conservative approximations that encompass a range of voltage values that respectively imply a corresponding range of current values within such conservative approximation;

wherein searching includes searching for a set of I-V constraints that includes an I-V constraint from a conservative approximation for a portion of every I-V curve and in which I-V constraints in such set of I-V constraints have overlapping voltage ranges; and wherein converting each respective region identified during the search to multiple smaller regions within each such identified region, includes converting a constraint within such identified region to multiple constraints each encompassing a smaller range of the voltage values of such identified region and each implying a corresponding range of current values.

26. An article of manufacture that includes a computer readable storage device encoded with computer readable instructions to perform a method comprising:

receiving a description of at least a portion of the circuit that identifies one or more devices that each includes at least one terminal and that identifies at least one connection between terminals of one or more of the identified devices;

receiving a description of a relationship between current values and voltage values represented as a curve (I-V curve relationship) for one or more of the identified devices;

converting each respective I-V curve relationship to multiple respective conservative approximations, each representing a respective portion of such respective I-V curve relationship as an interval that includes a range of one of current values or voltage values that implies an interval that includes a range of the other of current values or voltage values and that encompasses the respective portion of the respective I-V curve relationship;

assigning voltage labels to one or more terminals of one or more identified devices that indicate voltage relationships among the one or more terminals consistent with KVL;

defining a respective current relationship, among one or more respective sets of currents of the one or more of the identified devices that have one or more terminals that the circuit description indicates to have a connection between them, that is consistent with KCL; and searching a search space defined by the respective conservative approximations for a region of the search space that is bounded by a range of current and a range of voltage values that intersects with a respective conservative approximation of a respective portion of each respective I-V curve relationship and that is consistent with the voltage labels and that is consistent with each respective defined current relationship.

27. The article of claim 26 further including:

defining at least one constraint upon a property of at least one of the devices;

wherein searching includes searching for a region of the search space that is bounded by a range of current values and a range of voltage values that also satisfies the at least one constraint.

28. The article of claim 26 further including:

defining at least one constraint upon a physical dimension property of at least one of the devices;

wherein searching includes searching for a region of the search space that is bounded by a range of current values and a range of voltage values that also satisfies the at least one constraint.

29. The article of claim 26 further including:

defining at least one constraint upon an electrical property of at least one of the devices;

wherein searching includes searching for a region of the search space that is bounded by a range of current values and a range of voltage values that also satisfies the at least one constraint.

30. The article of claim 26 further including:

defining at least one constraint upon an environmental property of at least one of the devices;

wherein searching includes searching for a region of the search space that is bounded by a range of current values and a range of voltage values that also satisfies the at least one constraint.

31. The article of claim 26,
wherein converting includes formulating at least one SMT-LP expression that represents a region of a conservative approximation.

32. The article of claim 26,
wherein converting includes formulating at least one SMT-quadratic expression that represents a region of a conservative approximation.

33. The article of claim 26,
wherein converting includes formulating at least one hierarchical expression that represents a respective conservative approximation.

34. The article of claim 26 further including:
receiving an indication of an analysis;
wherein defining a respective current relationship includes defining relationships consistent with the indicated analysis.

35. The article of claim 26 further including:
receiving an indication of a DC analysis;
wherein defining a respective current relationship includes defining relationships consistent with DC analysis.

36. The article of claim 26 further including:
receiving an indication of a transient analysis;
wherein defining a respective current relationship includes defining relationships consistent with transient analysis.

37. The article of claim 26 further including:
receiving an indication of a PSS analysis;
wherein defining a respective current relationship includes defining relationships consistent with PSS analysis.

38. The article of claim 26,
wherein receiving a description of a relationship between current and voltage (I-V relationship) for one or more of the identified devices includes receiving the description from device models.

39. The article of claim 26,
wherein receiving a description of a relationship between current and voltage (I-V relationship) for one or more of the identified devices includes receiving information from measurements of physical devices.

40. The article of claim 26,
wherein searching involves use of an SMT solver.

41. The article of claim 26 further including:
receiving an indication of error tolerance criteria;
wherein searching includes until regions are obtained that meet the error tolerance criteria.

42. The article of claim 26,
wherein converting each respective I-V relationship to multiple respective conservative approximations, each representing a portion of a respective I-V curve relationship includes defining multiple regions within each conservative approximation, each such region associated with a different range of voltage values; and
wherein searching further includes searching to identify a combination of defined regions that includes at least a portion of a defined region for a portion of every I-V curve and in which the defined regions in such identified combination have overlapping voltage ranges.

43. The article of claim 42 further including:
converting each combination of defined regions identified during the search to multiple sub-regions within such defined region, each such sub-region associated with a different non-overlapping sub-range of the voltage values of such defined region; and
wherein searching further includes searching for a combination of sub-regions that includes a sub-region for a portion of every I-V curve and in which the sub-regions in such combination are associated with overlapping sub-voltage ranges.

44. The article of claim 43 further including:
converting each sub-region identified during the search to multiple new sub-regions within such sub-region, each such new sub-region associated with a different non-overlapping smaller sub-range of the voltage values of such sub-region; and
wherein searching further includes searching for a combination of new sub-regions that includes a new sub-region for a portion of every I-V curve and in which the new sub-regions in such combination are associated with overlapping new sub-voltage ranges.

45. An apparatus that includes:
a processor;
a non-transitory computer readable storage medium; and
a communication medium coupling the processor and the computer readable storage medium;
wherein the computer readable storage medium is encoded with computer readable instructions to perform a method comprising:
receiving a description of at least a portion of the circuit that identifies one or more devices that each includes at least one terminal and that identifies at least one connection between terminals of one or more of the identified devices;
receiving a description of a relationship between current values and voltage values represented as a curve (I-V curve relationship) for one or more of the identified devices;
converting each respective I-V curve relationship to multiple respective conservative approximations, each representing a respective portion of such respective I-V curve relationship as an interval that includes a range of one of current values or voltage values that implies an interval that includes a range of the other of current values or voltage values and that encompasses the respective portion of the respective I-V curve relationship;
assigning voltage labels to one or more terminals of one or more identified devices that indicate voltage relationships among the one or more terminals consistent with KVL;
defining a respective current relationship, among one or more respective sets of currents of the one or more of the identified devices that have one or more terminals that the circuit description indicates to have a connection between them, that is consistent with KCL; and
using a computer to search a search space defined by the respective conservative approximations for a region of the search space that is bounded by a range of current and a range of voltage values that intersects with a respective conservative approximation of a respective portion of each respective I-V curve relationship and that is consistent with the voltage labels and that is consistent with each respective defined current relationship.

* * * * *